(12) United States Patent
Leobandung

(10) Patent No.: US 12,094,937 B2
(45) Date of Patent: Sep. 17, 2024

(54) STACKED FIELD EFFECT TRANSISTOR DEVICES WITH REPLACEMENT GATE

(71) Applicant: INTERNATIONAL BUSINESS MACHINES CORPORATION, Armonk, NY (US)

(72) Inventor: Effendi Leobandung, Stormville, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 496 days.

(21) Appl. No.: 17/481,537

(22) Filed: Sep. 22, 2021

(65) Prior Publication Data

US 2023/0090588 A1   Mar. 23, 2023

(51) Int. Cl.
*H01L 27/092* (2006.01)
*H01L 29/10* (2006.01)
(Continued)

(52) U.S. Cl.
CPC .... *H01L 29/41725* (2013.01); *H01L 29/1033* (2013.01); *H01L 29/42372* (2013.01); *H01L 29/66545* (2013.01)

(58) Field of Classification Search
None
See application file for complete search history.

(56) References Cited

U.S. PATENT DOCUMENTS

| 7,804,137 B2 | 9/2010 | Kang et al. |
| 9,356,027 B1 | 5/2016 | Cheng et al. |

(Continued)

FOREIGN PATENT DOCUMENTS

| CN | 109473473 A | 3/2019 |
| CN | 111146279 A | 5/2020 |

(Continued)

OTHER PUBLICATIONS

Vandooren et al., "First Demonstration of 3D stacked Finfets at a 45nm fin pitch and 110nm gate pitch technology on 300mm wafers" In 2018 IEEE International Electron Devices Meeting (IEDM) Dec. 1, 2018, pp. 1-4.

(Continued)

*Primary Examiner* — Joseph C. Nicely
*Assistant Examiner* — Lamont B Koo
(74) *Attorney, Agent, or Firm* — Tutunjian & Bitetto, P.C.; Samuel Waldbaum

(57) ABSTRACT

A stacked field effect transistor device is provided. The stacked field effect transistor device includes a lower semiconductor channel segment between a first pair of source/drains, and an upper semiconductor channel segment between a second pair of source/drains. The stacked device further includes a gate dielectric layer on the upper and lower semiconductor channel segments, and a first work function material layer on the gate dielectric layer on the lower semiconductor channel segment. The stacked device further includes a first conductive gate fill on the first work function material layer, and a replacement work function material layer on the gate dielectric layer on the upper semiconductor channel segment and the first conductive gate fill, wherein the replacement work function material layer is a different work function material from the first work function material layer. The device further includes a replacement conductive gate fill on the replacement work function material layer.

19 Claims, 15 Drawing Sheets

(51) Int. Cl.
*H01L 29/417* (2006.01)
*H01L 29/423* (2006.01)
*H01L 29/66* (2006.01)

(56) References Cited

U.S. PATENT DOCUMENTS

| | | |
|---|---|---|
| 9,515,164 B2 | 12/2016 | Ando et al. |
| 9,659,963 B2 | 5/2017 | Cheng et al. |
| 9,812,575 B1 | 11/2017 | Reznicek et al. |
| 10,056,391 B2 | 8/2018 | Adusumilli et al. |
| 10,084,090 B2 | 9/2018 | Cheng et al. |
| 10,304,844 B1 | 5/2019 | Balakrishnan et al. |
| 10,381,273 B1 | 8/2019 | Cheng et al. |
| 10,700,064 B1 | 6/2020 | Zhang et al. |
| 2019/0131184 A1* | 5/2019 | Ando .................... H01L 27/092 |

FOREIGN PATENT DOCUMENTS

| | | |
|---|---|---|
| CN | 112420831 A | 2/2021 |
| CN | 113097290 A | 7/2021 |

OTHER PUBLICATIONS

International Search Report issued in corresponding PCT Application Serial No. PCT/CN2022/108281 dated Oct. 8, 2022, pp. 1-4.

\* cited by examiner

STACKED FIELD EFFECT TRANSISTOR DEVICES WITH REPLACEMENT GATE

BACKGROUND

The present invention generally relates to a dual replacement gate stack for stacked field effect transistors (FETs), and more particularly to stacked n-type and p-type FETs having dual replacement gates.

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate. Depending on the doping of the source and drain, an n-FET or a p-FET can be formed.

SUMMARY

In accordance with an embodiment of the present invention, a stacked field effect transistor device is provided. The stacked field effect transistor device includes a lower semiconductor channel segment between a first pair of source/drains, and an upper semiconductor channel segment between a second pair of source/drains. The stacked field effect transistor device further includes a gate dielectric layer on the upper semiconductor channel segment and the lower semiconductor channel segment, and a first work function material layer on the gate dielectric layer on the lower semiconductor channel segment. The stacked field effect transistor device further includes a first conductive gate fill on the first work function material layer, and a replacement work function material layer on the gate dielectric layer on the upper semiconductor channel segment and on the first conductive gate fill, wherein the replacement work function material layer is a different work function material from the first work function material layer. The stacked field effect transistor device further includes a replacement conductive gate fill on the replacement work function material layer.

In accordance with another embodiment of the present invention, a stacked field effect transistor device is provided. The stacked field effect transistor device includes a support pillar on a substrate, and an isolation layer on opposite sides of the support pillar. The stacked field effect transistor device further includes a lower semiconductor channel segment over the support pillar, and an upper semiconductor channel segment over the lower semiconductor channel segment, wherein the upper semiconductor channel segment and lower semiconductor channel segment are vertically aligned. The stacked field effect transistor device further includes a gate dielectric layer on the upper semiconductor channel segment and the lower semiconductor channel segment, and a first work function material layer on the gate dielectric layer on the lower semiconductor channel segment. The stacked field effect transistor device further includes a first conductive gate fill on the first work function material layer, and a replacement work function material layer on the gate dielectric layer on the upper semiconductor channel segment and on the first conductive gate fill, wherein the replacement work function material layer is a different work function material from the first work function material layer. The stacked field effect transistor device further includes a replacement conductive gate fill on the replacement work function material layer.

In accordance with yet another embodiment of the present invention, a method of forming a stacked field effect transistor device is provided. The method includes forming a lower semiconductor channel segment and an upper semiconductor channel segment over the lower semiconductor channel segment on a substrate, and forming a gate dielectric layer on the upper semiconductor channel segment and the lower semiconductor channel segment. The method further includes forming a first work function material layer on the upper semiconductor channel segment and the lower semiconductor channel segment, and forming a first conductive gate fill on the first work function material layer. The method further includes removing a portion of the first conductive gate fill and the first work function material layer from the upper semiconductor channel segment, and forming a replacement work function material layer on the gate dielectric layer on the upper semiconductor channel segment and on the first conductive gate fill, wherein the replacement work function material layer is a different work function material from the first work function material layer. The method further includes forming a replacement conductive gate fill on the replacement work function material layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide a stacked field effect transistor that can reduce static random access memory (SRAM) area. The n-type FET (nFET) and the p-type FET (pFET) can each be a nanosheet type device architecture with the source/drains for one device above the other.

Embodiments of the present invention provide a stacked field effect transistor with different work function material layers for the n-type FET (nFET) and the p-type FET (pFET). A first work function material can be formed on the nanosheet of a lower FET device and a second work function material can be formed on the nanosheet of the upper FET device in the stack.

Embodiments of the present invention provide a method of fabricating a stacked field effect transistor with different work function material layers for the n-type FET (nFET) and the p-type FET (pFET). A first work function material layer can be formed on both the n-type FET (nFET) and the p-type FET (pFET), and the first work function material layer on the upper FET device can be replaced with a different second work function material layer to improve performance of both stacked FETs.

Exemplary applications/uses to which the present invention can be applied include, but are not limited to: SRAM memory cells, Latches, and logic computational circuits.

It is to be understood that aspects of the present invention will be described in terms of a given illustrative architecture; however, other architectures, structures, substrate materials and process features and steps can be varied within the scope of aspects of the present invention.

Figure 1:
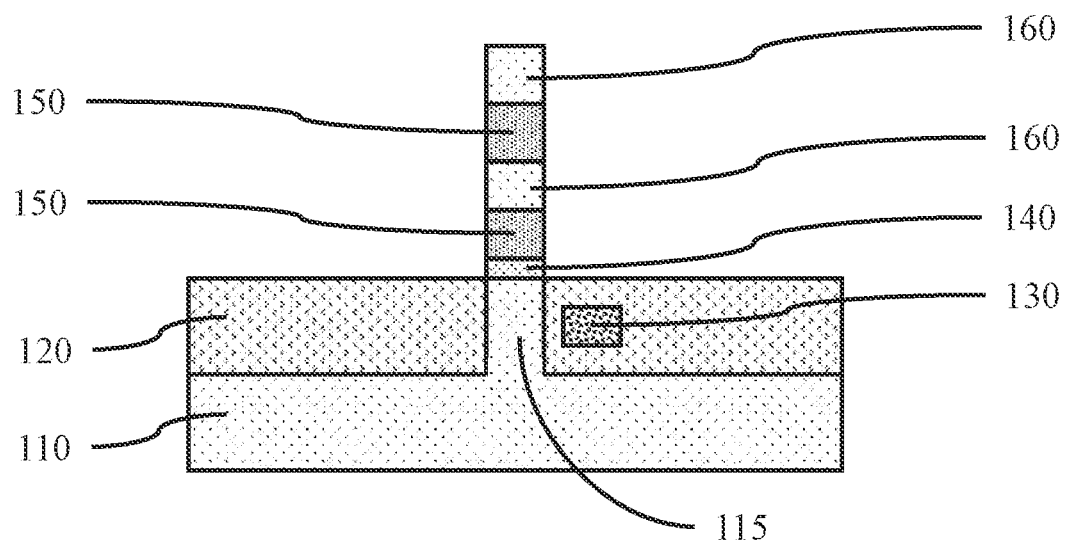
FIG. 1 is a cross-sectional side view showing a stack of semiconductor channel layers and sacrificial layers on a substrate with a buried power rail, in accordance with an embodiment of the present invention.

Referring now to the drawings in which like numerals represent the same or similar elements and initially to FIG. 1, FIG. 1 is a cross-sectional side view showing a stack of semiconductor channel layers and sacrificial layers on a substrate with a buried power rail, in accordance with an embodiment of the present invention.

In one or more embodiments, a base sacrificial layer 140 can be formed on a substrate 110, and a stack of alternating semiconductor channel layers 160 and sacrificial layers 150 can be formed on the base sacrificial layer 140, where the base sacrificial layer 140, channel layers 160, and sacrificial layers 150 can be formed by epitaxial growth on the substrate 110. A base sacrificial layer 140 can be between a lower sacrificial layer 150 and a support pillar 115. A lower semiconductor channel layer 160 can be on the lower sacrificial layer 150. The support pillar 115 can be formed from the same material as the substrate 110.

In various embodiments, the semiconductor channel layers 160 can be silicon (Si) and the base sacrificial layer 140 and sacrificial layers 150 can be silicon-germanium (SiGe). The base sacrificial layer 140 can be silicon-germanium (SiGe) with a different concentration of germanium than the sacrificial layers 150 to allow selective removal of the base sacrificial layer 140. In various embodiments, the base sacrificial layer 140 can be silicon-germanium (SiGe) with a germanium concentration of about 25 atomic percent (at. %), and the sacrificial layers 150 can be silicon-germanium (SiGe) with a germanium concentration of about 50 at. %. In various embodiments, a different combination of germanium (Ge) concentrations can be used, where the base sacrificial layer 140 has a higher Ge concentration than the sacrificial layers 150.

In various embodiments, the base sacrificial layer 140 can have a thickness in a range of about 10 nanometers (nm) to about 60 nm, or about 30 nm to about 40 nm, although other thicknesses are also contemplated. The base sacrificial layer 140 can be sufficiently thick to allow formation of a dielectric layer between the overlying sacrificial layer 150 and the top surface of the support pillar 115.

In various embodiments, the sacrificial layers 150 can have a thickness in a range of about 10 nanometers (nm) to about 60 nm, or about 20 nm to about 30 nm, although other thicknesses are also contemplated. The sacrificial layers 150 can be sufficiently thick to allow formation of a gate structure between the semiconductor channel layers 160.

In various embodiments, the semiconductor channel layers 160 can have a thickness in a range of about 1 nm to about 20 nm, or about 3 nm to about 12 nm, or about 4 nm to about 6 nm, although other thicknesses are also contemplated. The semiconductor channel layers 160 can be sufficiently thick to provide conductive channel properties for the devices.

In one or more embodiments, an isolation layer 120 can be formed on a substrate 110 where the isolation layer 120 can be adjacent to a support pillar 115. The isolation layer 120 can be formed by etching the substrate 110 adjacent to a stack of nanosheet layers, including, semiconductor channel layers 160 and sacrificial layers 150, to form the support pillar 115 beneath the stack of nanosheet layers. An electrically insulating dielectric material can be deposited on the substrate 110 adjacent to the support pillar 115 and stack of nanosheet layers, for example, using a blanket deposition followed by planarization and selective etch-back.

In various embodiments, the substrate 110 can be a semiconductor material, including, but not limited to a type IV semiconductor (e.g., silicon (Si), germanium (Ge), a IV-IV compound semiconductor (e.g., silicon germanium (SiGe), silicon carbide (SiC), a III-V compound semiconductor (e.g., gallium arsenide (GaAs), gallium nitride (GaN), a II-VI compound semiconductor (e.g., Cadmium selenide (CdSe), Cadmium sulfide (CdS), Cadmium telluride (CdTe), zinc oxide (ZnO)). The substrate 110 can be a single crystal material wafer, a polycrystalline material wafer, or a semiconductor-on-insulator (SeOI) wafer.

In one or more embodiments, a power rail 130 can be formed in the isolation layer 120, where the power rail can be formed by forming a trench in the isolation layer 120 and depositing a conductive material in the trench. An electrically insulating dielectric material can be deposited on the power rail 130 to fill in the trench. The power rail 130 can provide a signal, voltage, and/or current to the stacked FET devices.

Figure 2:
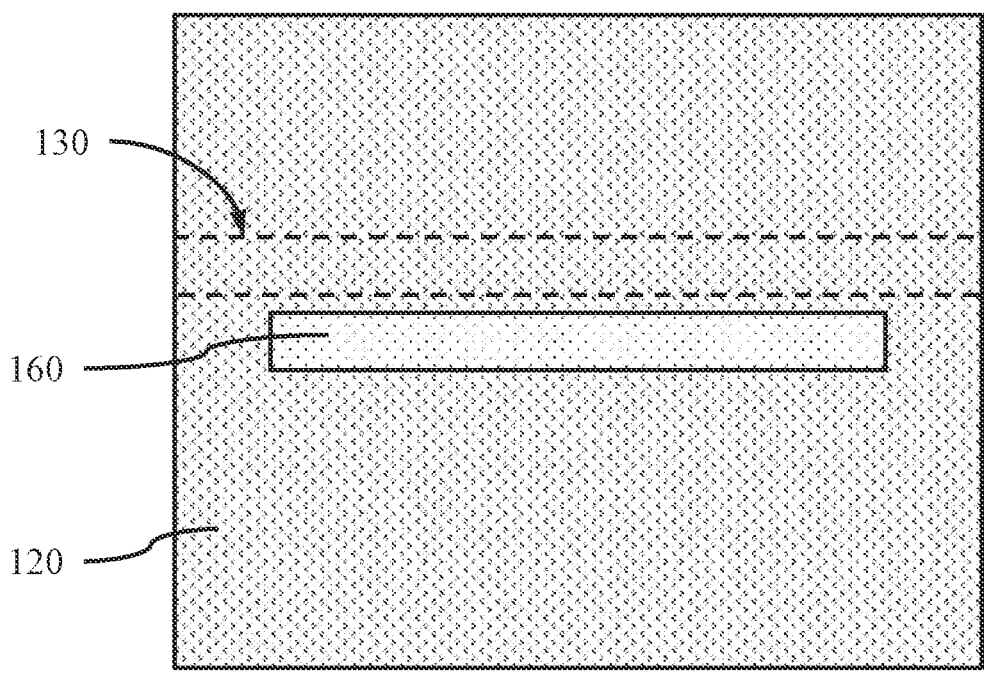
FIG. 2 is a top view showing a stack of semiconductor channel layers and sacrificial layers on a substrate with a buried power rail, in accordance with an embodiment of the present invention.

FIG. 2 is a top view showing a stack of semiconductor channel layers and sacrificial layers on a substrate with a buried power rail, in accordance with an embodiment of the present invention.

In one or more embodiments, the power rail 130 can be a buried power rail laterally offset from the stack of nanosheet layers. The isolation layer 120 can cover the substrate surface around the stack of nanosheet layers, where the base sacrificial layer 140, channel layers 160, and sacrificial layers 150 can extend above the top surface of the isolation layer 120.

Figure 3:
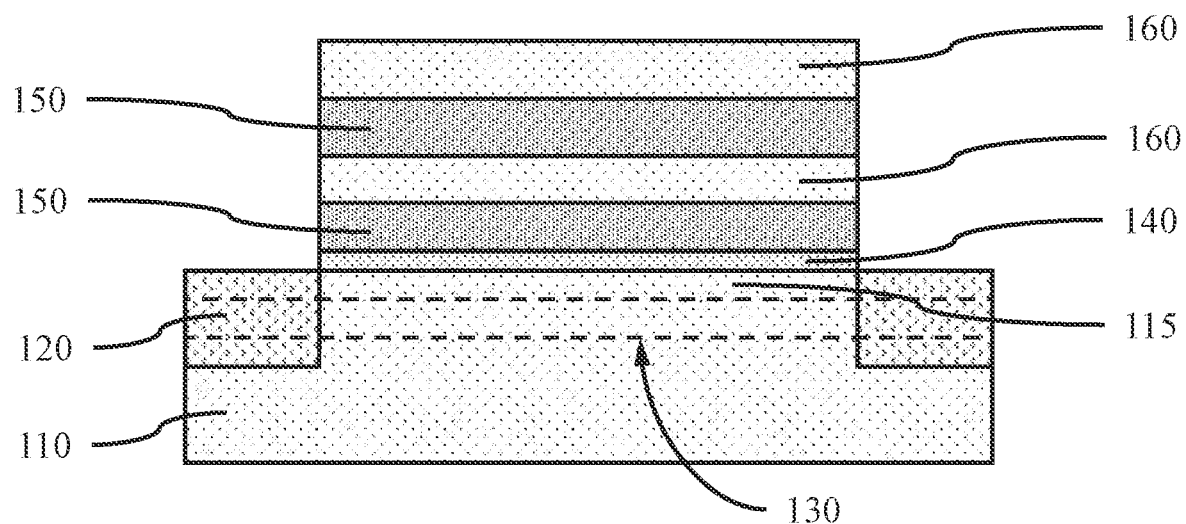
FIG. 3 is a cross-sectional side view perpendicular to FIG. 1 showing a stack of semiconductor channel layers and sacrificial layers on a substrate with a buried power rail, in accordance with an embodiment of the present invention.

FIG. 3 is a cross-sectional side view perpendicular to FIG. 1 showing a stack of semiconductor channel layers and sacrificial layers on a substrate with a buried power rail, in accordance with an embodiment of the present invention.

In one or more embodiments, the power rail 130 can be positioned between the top surface and the bottom surface of the isolation layer 120. The support pillar 115, base sacrificial layer 140, channel layers 160, and sacrificial layers 150 can have a long axis and a short axis, where the short axis is across the width of the stack of nanosheet layers.

Figure 4:
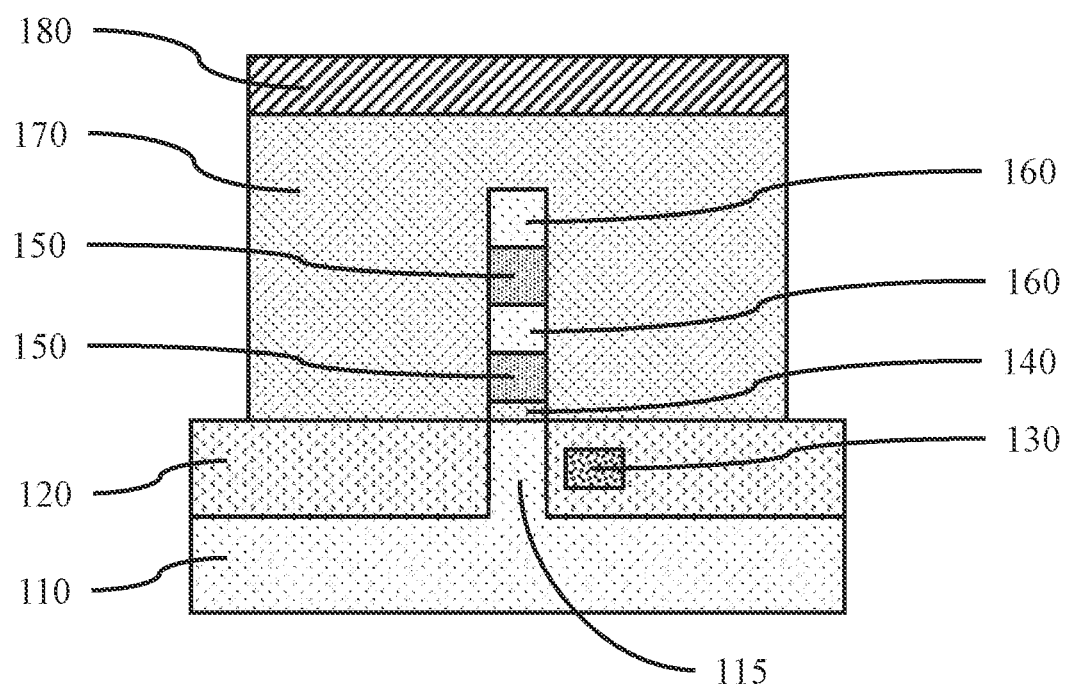
FIG. 4 is a cross-sectional side view showing a dummy gate structure on the stack of semiconductor channel layers and sacrificial layers and the substrate, in accordance with an embodiment of the present invention.

FIG. 4 is a cross-sectional side view showing a dummy gate structure on the stack of semiconductor channel layers and sacrificial layers and the substrate, in accordance with an embodiment of the present invention.

In one or more embodiments, a dummy gate structure can be formed on the stack of base sacrificial layer 140, channel layers 160, and sacrificial layers 150, and the substrate 110. The dummy gate structure can include a dummy gate fill 170 and a dummy gate cap 180, where the dummy gate fill 170 and a dummy gate cap 180 are athwart the stack of nanosheets.

In various embodiments, the dummy gate fill 170 can be a material that is selectively etchable relative to other exposed materials, for example, amorphous silicon (a-Si), amorphous carbon (a-C), or a combination thereof.

In various embodiments, the dummy gate cap 180 can be a hardmask material, including, but not limited to, silicon oxide (SiO), silicon nitride (SiN), silicon oxynitride (SiON), silicon carbide (SiC), or a combination thereof.

Figure 5:
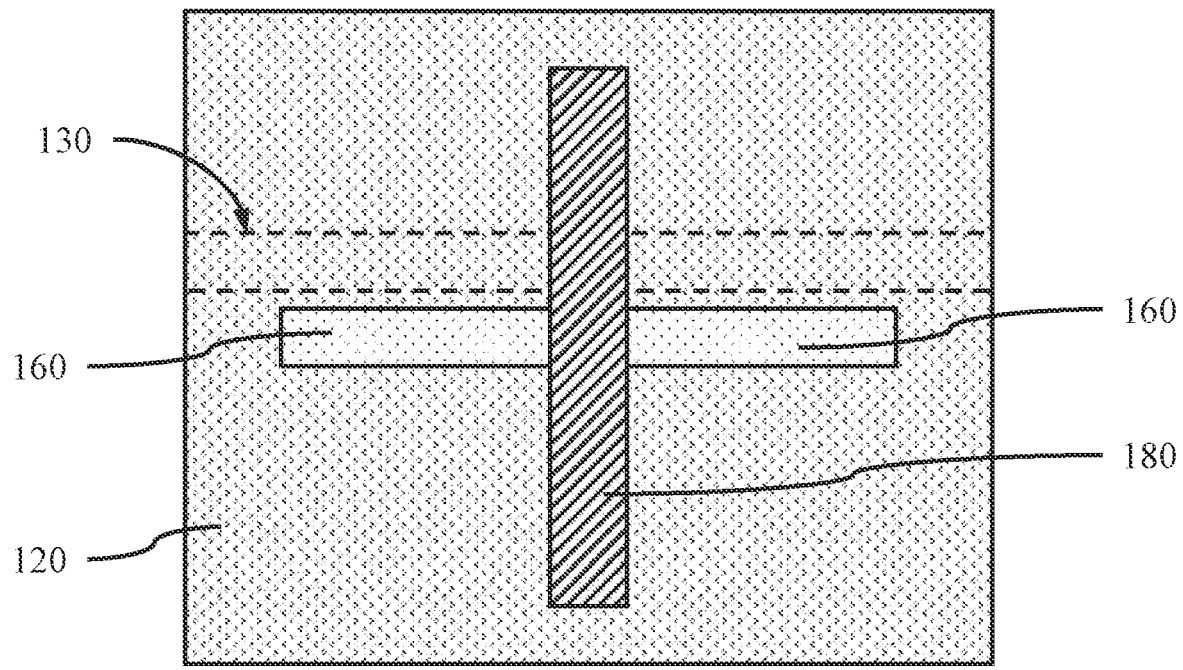
FIG. 5 is a top view showing the dummy gate structure across the stack of semiconductor channel layers and sacrificial layers and the power rail, in accordance with an embodiment of the present invention.

FIG. 5 is a top view showing the dummy gate structure across the stack of semiconductor channel layers and sacrificial layers and the power rail, in accordance with an embodiment of the present invention.

In one or more embodiments, the base sacrificial layer 140, channel layers 160, and sacrificial layers 150 extend outward from the sidewalls of the dummy gate fill 170, and the dummy gate structure extends over the region of the power rail 130.

Figure 6:
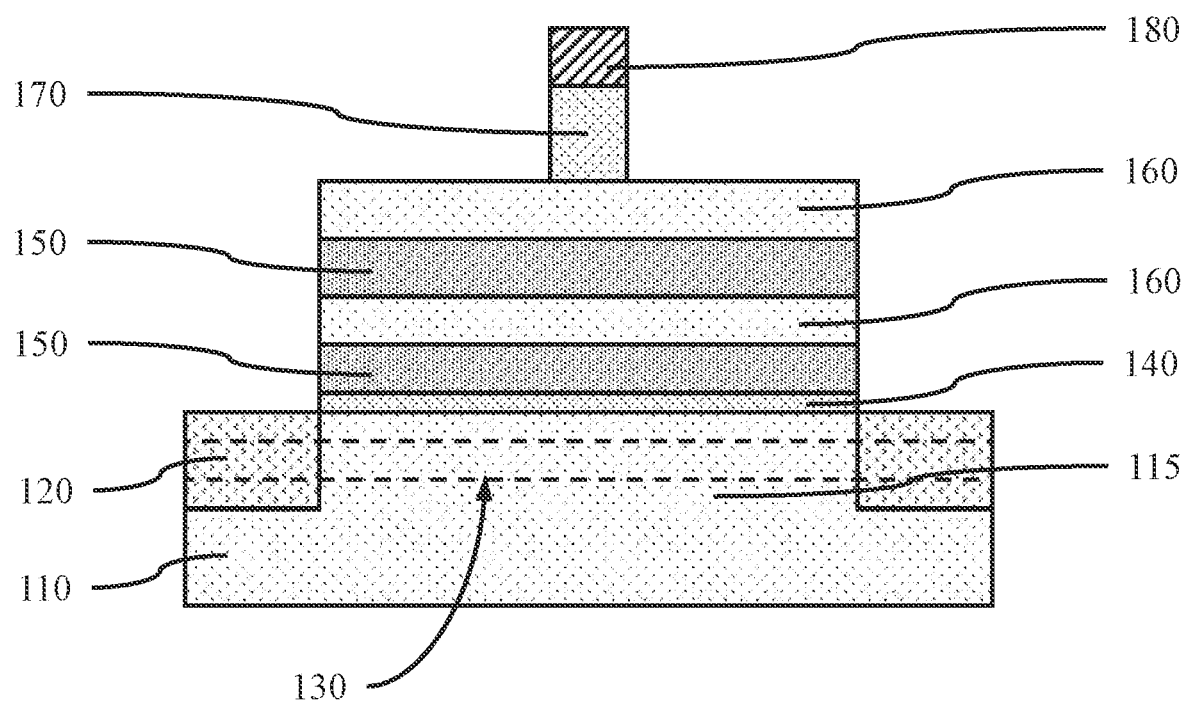
FIG. 6 is a cross-sectional side view perpendicular to FIG. 4 showing the dummy gate structure over the top of the stack of semiconductor channel layers and sacrificial layers on a substrate with a buried power rail, in accordance with an embodiment of the present invention.

FIG. 6 is a cross-sectional side view perpendicular to FIG. 4 showing the dummy gate structure over the top of the stack of semiconductor channel layers and sacrificial layers on a substrate with a buried power rail, in accordance with an embodiment of the present invention.

In one or more embodiments, the dummy gate fill 170 can be centered on the stack of nanosheets and wrap around three sides of the stack.

Figure 7:
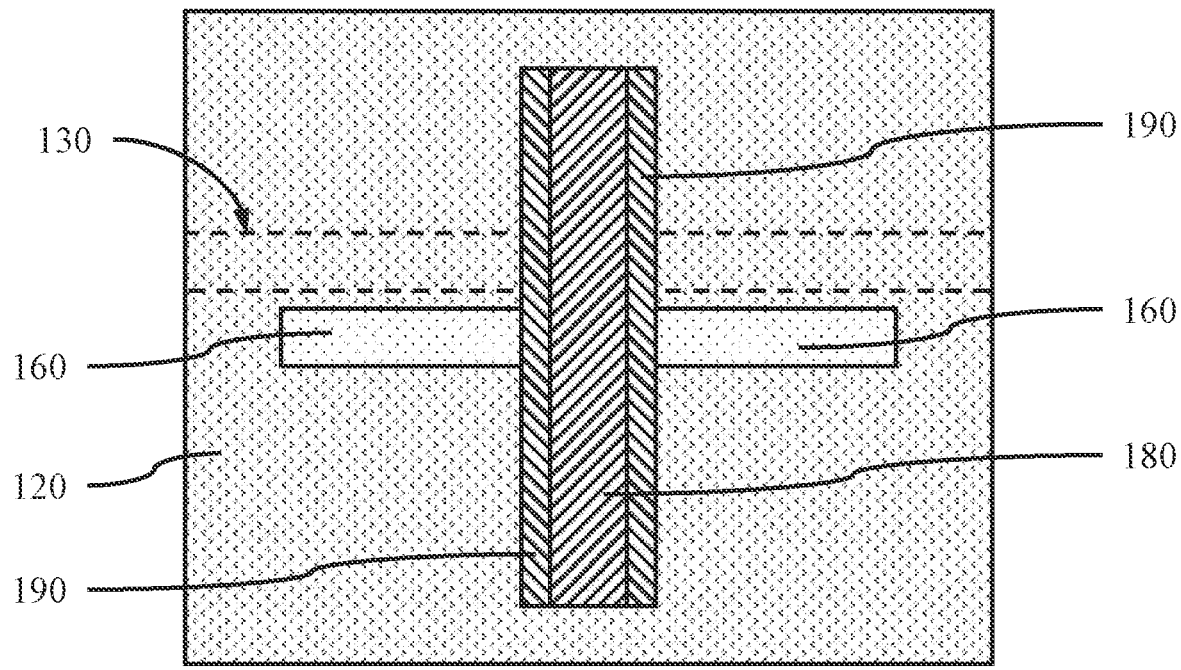
FIG. 7 is a top view showing a pair of sidewall spacers formed on opposite sides of the dummy gate structure, in accordance with an embodiment of the present invention.

FIG. 7 is a top view showing a pair of sidewall spacers formed on opposite sides of the dummy gate structure, in accordance with an embodiment of the present invention.

In one or more embodiments, a sidewall spacer 190 can be formed on each of the opposite sides of the dummy gate structure. The can be a hardmask material, including, but not limited to, silicon oxide (SiO), silicon nitride (SiN), silicon oxynitride (SiON), silicon carbide (SiC), silicon boro carbonitride (SiBCN), and combinations thereof.

In various embodiments, the sidewall spacers 190 can have a thickness in a range of about 3 nanometers (nm) to about 20 nm, or about 4 nm to about 15 nm, or about 5 nm to about 8 nm, although other thicknesses are also contemplated. The sidewall spacers 190 can be sufficiently thick to protect the nanosheet stack and define a predetermined gate length and device channel length for the semiconductor channel layers 160.

Figure 8:
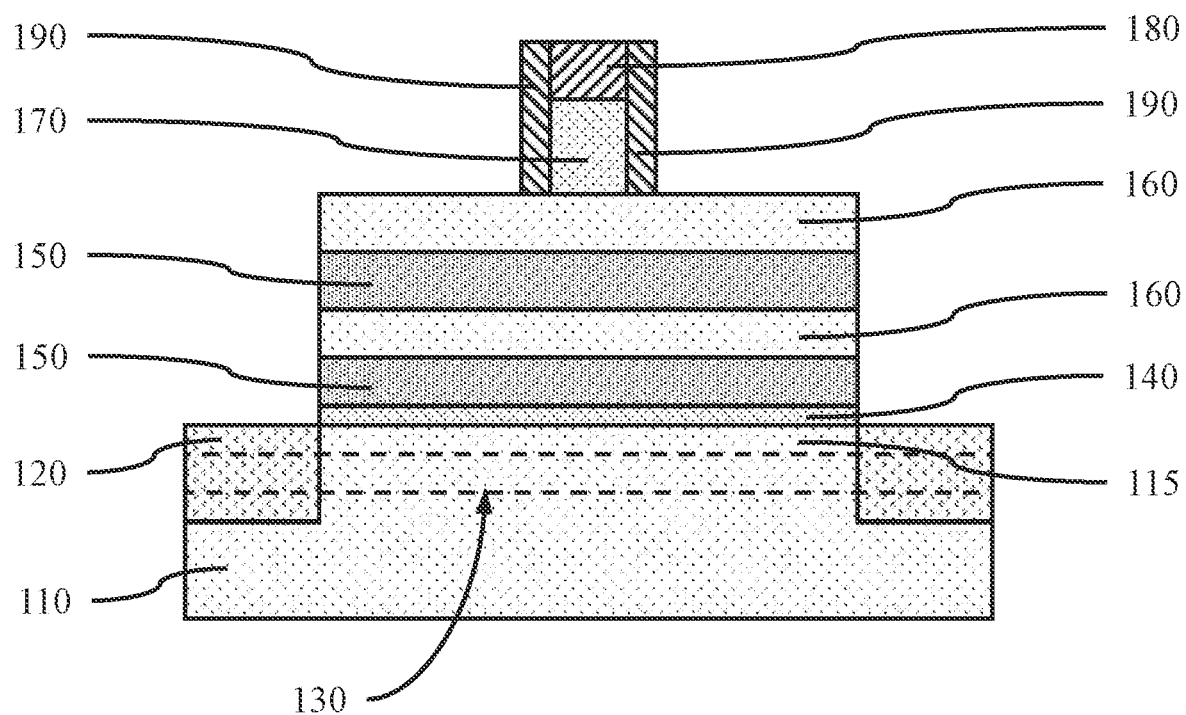
FIG. 8 is a cross-sectional side view perpendicular to FIG. 4 showing the pair of sidewall spacers formed on opposite sides of the dummy gate structure, in accordance with an embodiment of the present invention.

FIG. 8 is a cross-sectional side view perpendicular to FIG. 4 showing the pair of sidewall spacers formed on opposite sides of the dummy gate structure, in accordance with an embodiment of the present invention.

In various embodiments, the pair of sidewall spacers 190 can be on opposite sides of the dummy gate structure and wrap around three sides of the stack.

Figure 9:
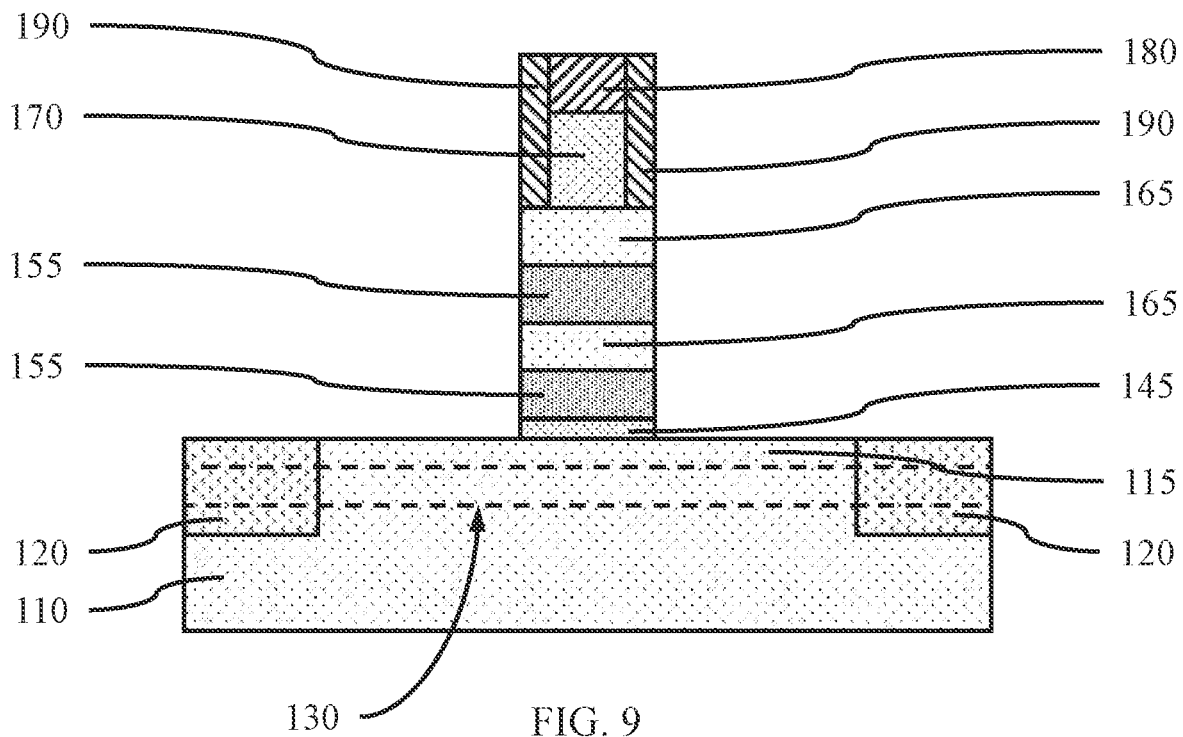
FIG. 9 is a cross-sectional side view perpendicular to FIG. 4 showing the stack of semiconductor channel layers and sacrificial layers trimmed to the sides of the sidewall spacers, in accordance with an embodiment of the present invention.

FIG. 9 is a cross-sectional side view perpendicular to FIG. 4 showing the stack of semiconductor channel layers and sacrificial layers trimmed to the sides of the sidewall spacers, in accordance with an embodiment of the present invention.

In one or more embodiments, the portions of the base sacrificial layer 140, channel layers 160, and sacrificial layers 150 extending outwards from the sidewall spacers 190 and gate cap 180 can be removed using selective directional etching, for example, reactive ion etching (RIE). Removing the exposed portions of the base sacrificial layer 140, channel layers 160, and sacrificial layers 150 can reduce the length of the nanosheet stack and form a base sacrificial segment 145, semiconductor channel segments 165, and sacrificial segments 155.

In various embodiments, the base sacrificial segment 145, semiconductor channel segments 165, and sacrificial segments 155 can each have a length in a range of about 10 nm to about 100 nm, or about 15 nm to about 50 nm, or about 20 nm to about 30 nm, although other lengths are also contemplated. The length can determine the device width for the stacked n-type FET (nFET) and the p-type FET (pFET) devices.

Figure 10:
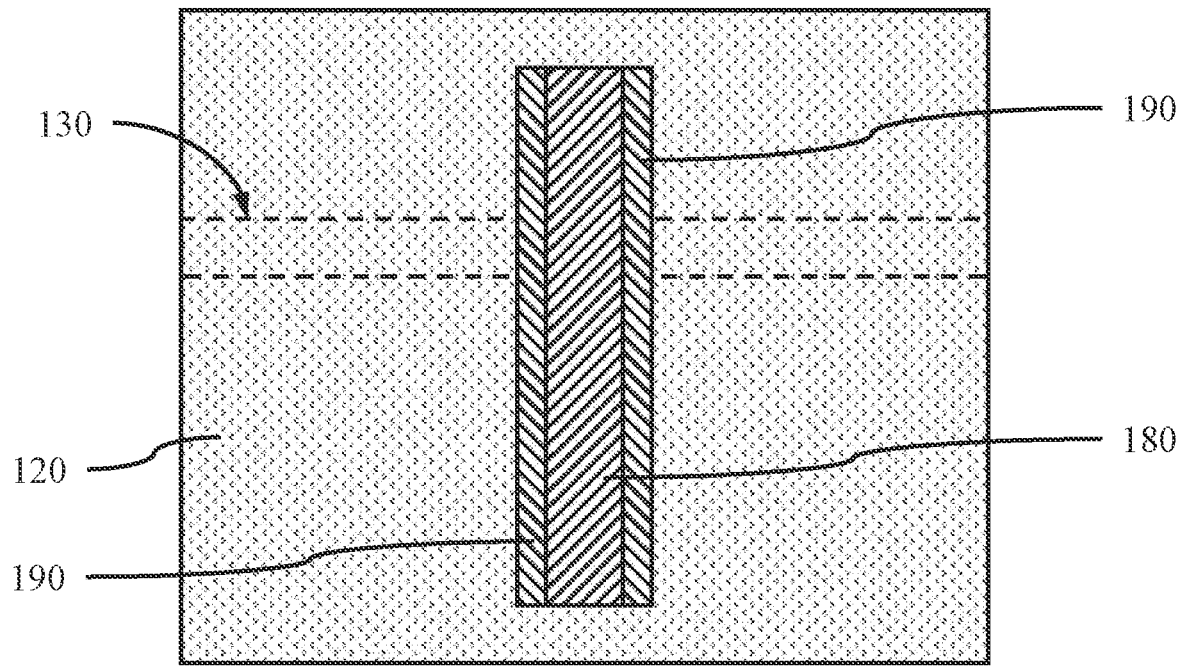
FIG. 10 is a top view showing the stack of semiconductor channel layers and sacrificial layers trimmed to the sides of the sidewall spacers, in accordance with an embodiment of the present invention.

FIG. 10 is a top view showing the stack of semiconductor channel layers and sacrificial layers trimmed to the sides of the sidewall spacers, in accordance with an embodiment of the present invention.

In one or more embodiments, the base sacrificial segment 145, channel segments 165, and sacrificial segments 155 can be beneath the dummy gate structure and sidewall spacers 190. The top surface of the isolation layer 120 can be exposed around the dummy gate structure and sidewall spacers 190.

Figure 11:
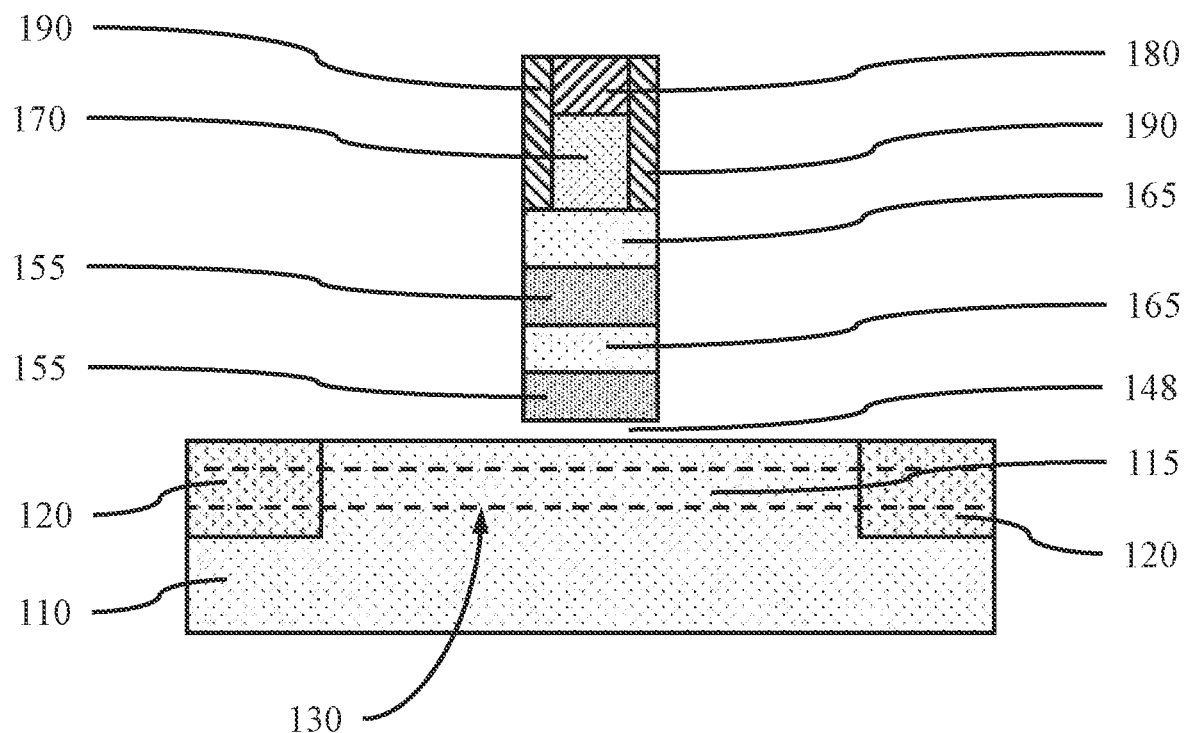
FIG. 11 is a cross-sectional side view perpendicular to FIG. 4 showing the base sacrificial layer removed to form a channel beneath the remaining stack of semiconductor channel segments and sacrificial segments, in accordance with an embodiment of the present invention.

FIG. 11 is a cross-sectional side view perpendicular to FIG. 4 showing the base sacrificial layer removed to form a channel beneath the remaining stack of semiconductor channel segments and sacrificial segments, in accordance with an embodiment of the present invention.

In one or more embodiments, the base sacrificial segment 145 can be removed from between the overlying sacrificial segment 155 and the underlying support pillar 115, where the base sacrificial segment 145 can be removed using a selective isotropic etch, for example, a wet chemical etch. Removal of the base sacrificial segment 145 can form a channel 148 beneath the remaining stack of semiconductor channel segments 165 and sacrificial segments 155. The channel 148 can extend from one side of the semiconductor channel segments 165 and sacrificial segments 155 to an opposite side, where the channel 148 is beneath the dummy gate structure.

Figure 12:
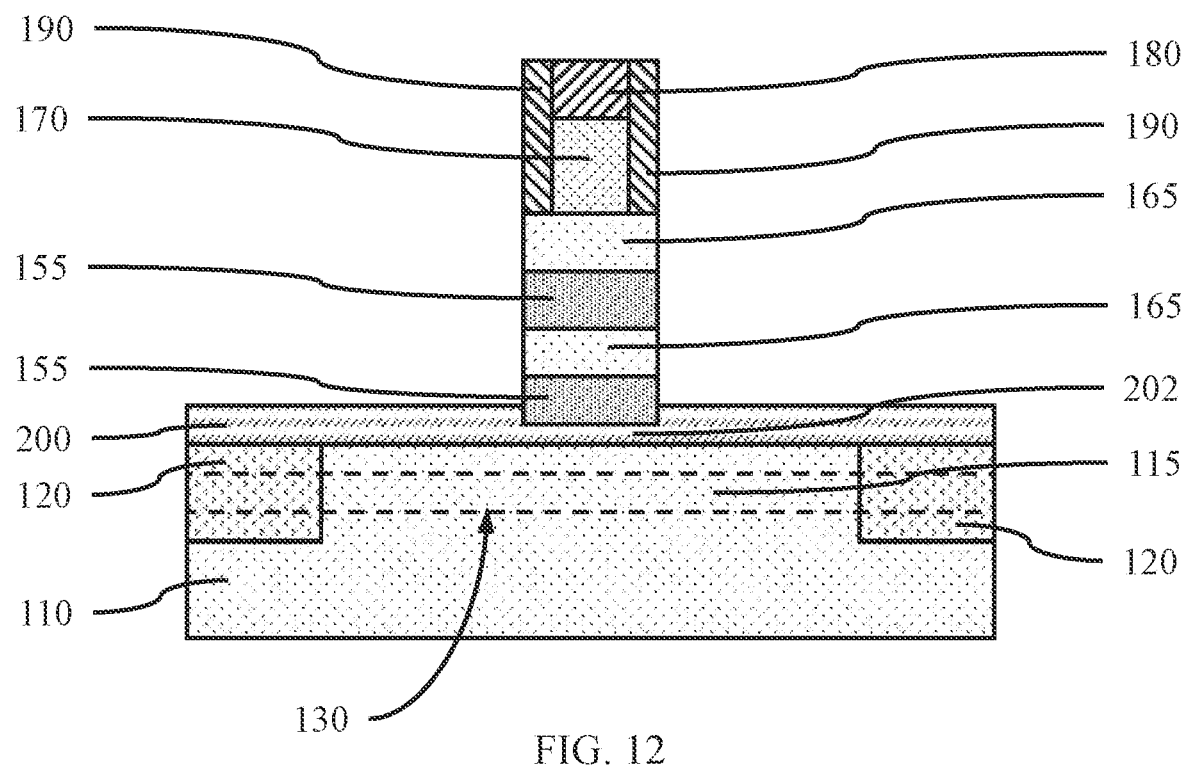
FIG. 12 is a cross-sectional side view perpendicular to FIG. 4 showing an insulating layer formed on the substrate and in the channel beneath the remaining stack of semiconductor channel segments and sacrificial segments, in accordance with an embodiment of the present invention.

FIG. 12 is a cross-sectional side view perpendicular to FIG. 4 showing an insulating layer formed on the substrate and in the channel beneath the remaining stack of semiconductor channel segments and sacrificial segments, in accordance with an embodiment of the present invention.

In one or more embodiments, an insulating layer 200 can be formed on the support pillar 115 in the channel 148 beneath the lower sacrificial segment 155. The insulating layer 200 can be formed with a conformal silicon oxide (SiO) or silicon nitride (SiN) that can fill the channel 148. A top surface of the insulating layer 200 can be above the bottom surface of the lower sacrificial segment 155.

In various embodiments, the insulating layer 200 can have a thickness adjacent to the lower sacrificial segment 155 in a range of about 10 nm to about 70 nm, or about 30 nm to about 50 nm, although other thicknesses are also contemplated.

Figure 13:
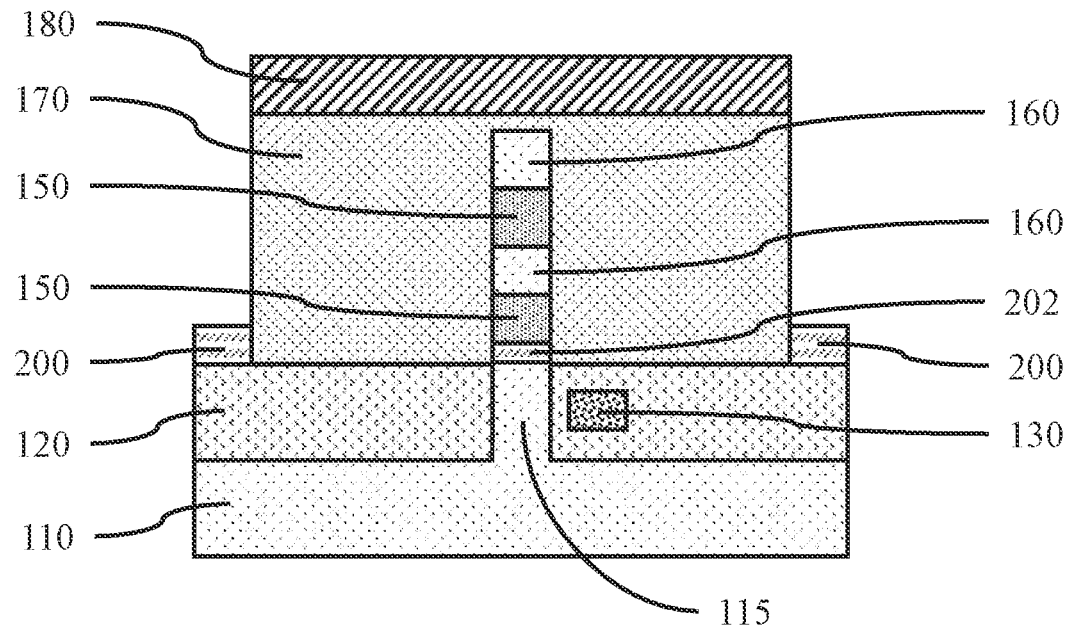
FIG. 13 is a cross-sectional side view showing a portion of the insulating layer beneath the remaining stack of semiconductor channel segments and sacrificial segments, in accordance with an embodiment of the present invention.

FIG. 13 is a cross-sectional side view showing a portion of the insulating layer beneath the remaining stack of semiconductor channel segments and sacrificial segments, in accordance with an embodiment of the present invention.

In various embodiments, the insulating layer 200 can surround the dummy gate fill 170 of the dummy gate structure on the substrate 110 and isolation layer 120.

Figure 14:
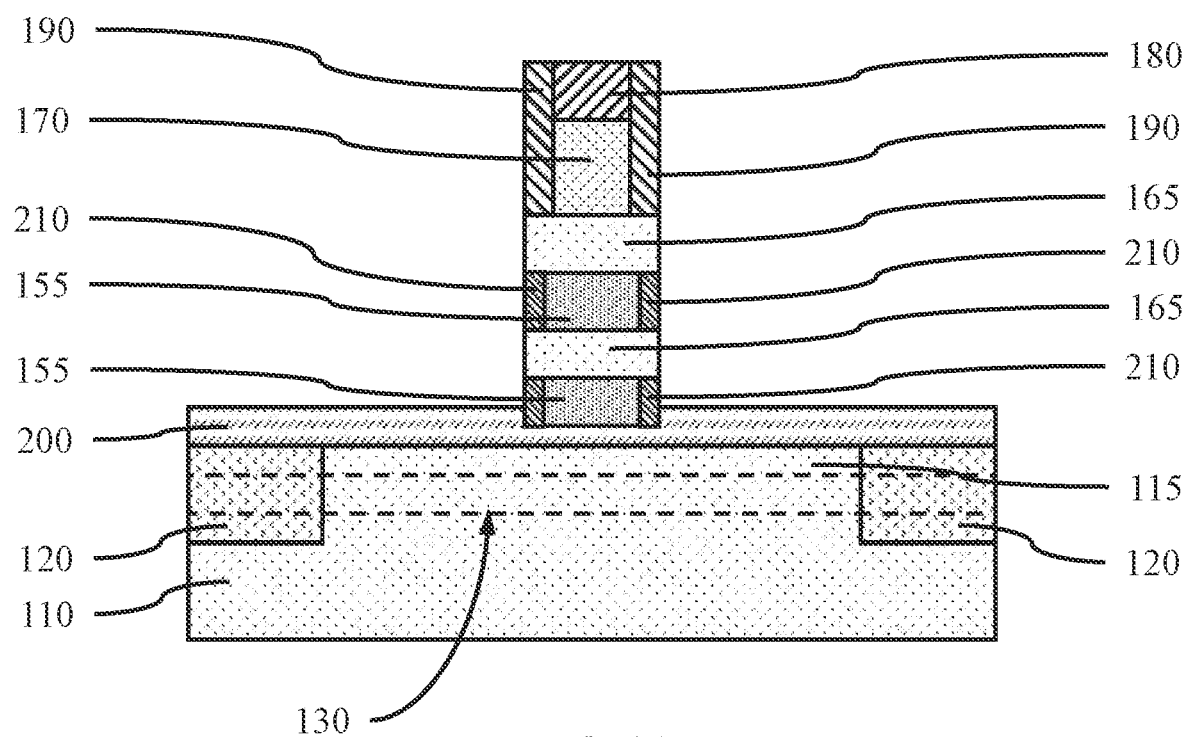
FIG. 14 is a cross-sectional side view perpendicular to FIG. 13 showing portions of the sacrificial segments replaced with inner spacers, in accordance with an embodiment of the present invention.

FIG. 14 is a cross-sectional side view perpendicular to FIG. 13 showing portions of the sacrificial segments replaced with inner spacers, in accordance with an embodiment of the present invention.

In one or more embodiments, exposed portions of the sacrificial segments 155 can be removed using a selective, isotropic etch (e.g., wet chemical etch, dry plasma etch) to form recesses in the sacrificial segments 155 between the channel segments 165, and between the lower channel segment 165 and the insulating layer 200.

In one or more embodiments, inner spacers 210 can be formed on the sacrificial segments 155 in the recesses, where the inner spacers 210 can be formed using a conformal deposition, for example, atomic layer deposition (ALD), and plasma enhanced atomic layer deposition (PEALD).

In various embodiments, the inner spacers 210 can be an insulating dielectric material, including, but not limited to, silicon oxide (SiO), silicon nitride (SiN), silicon oxynitride (SiON), silicon carbide (SiC), silicon boro carbonitride (SiBCN), boron nitride (BN), and combinations thereof.

Figure 15:
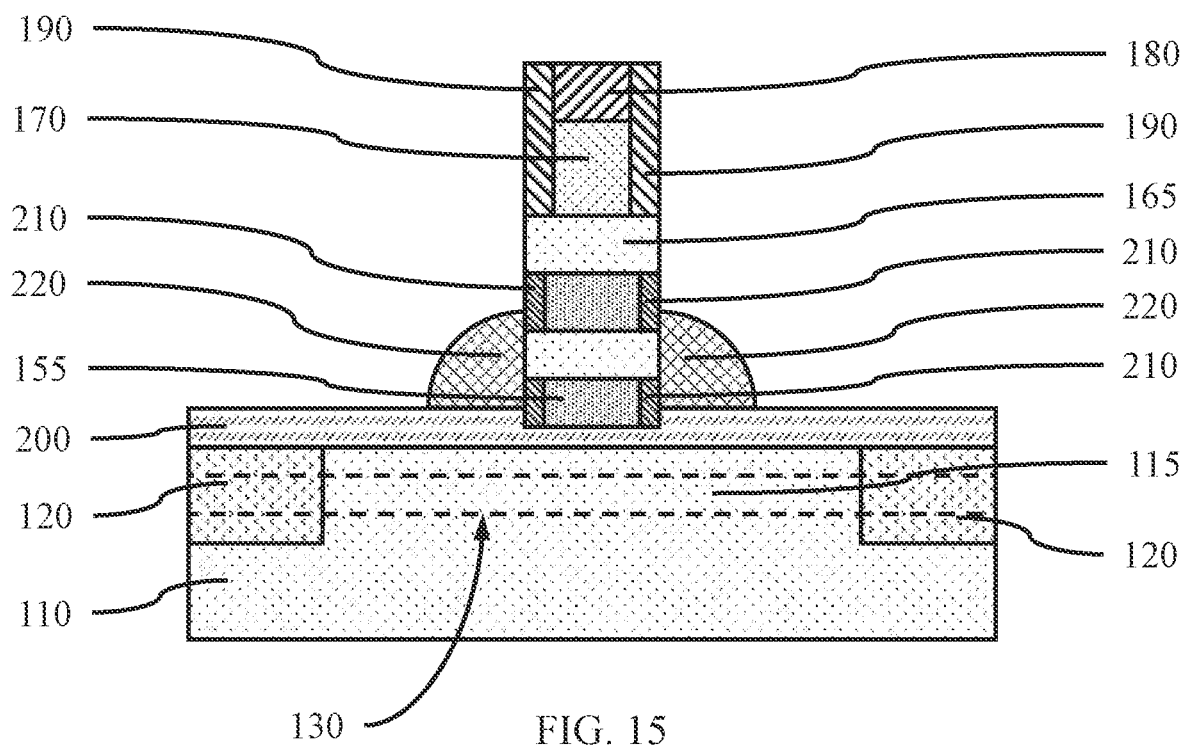
FIG. 15 is a cross-sectional side view perpendicular to FIG. 13 showing a first pair of disposable spacers formed on the insulating layer on opposite sides of a lower nanosheet, in accordance with an embodiment of the present invention.

FIG. 15 is a cross-sectional side view perpendicular to FIG. 13 showing a first pair of disposable spacers formed on the insulating layer on opposite sides of a lower nanosheet, in accordance with an embodiment of the present invention.

In one or more embodiments, a disposable spacer 220 can be formed on each of the opposite sides of the stack of channel segments 165, and sacrificial segments 155. The disposable spacers 220 can be formed by a conformal deposition (e.g., ALD, PEALD), and etched back to form the rounded elongated shape.

In various embodiments, the first pair of disposable spacer 220 can be a selectively etchable material, including, but not limited to, amorphous silicon (a-Si), amorphous carbon (a-C), silicon oxide (SiO), silicon nitride (SiN), silicon oxynitride (SiON), silicon carbide (SiC), and combinations thereof.

Figure 16:
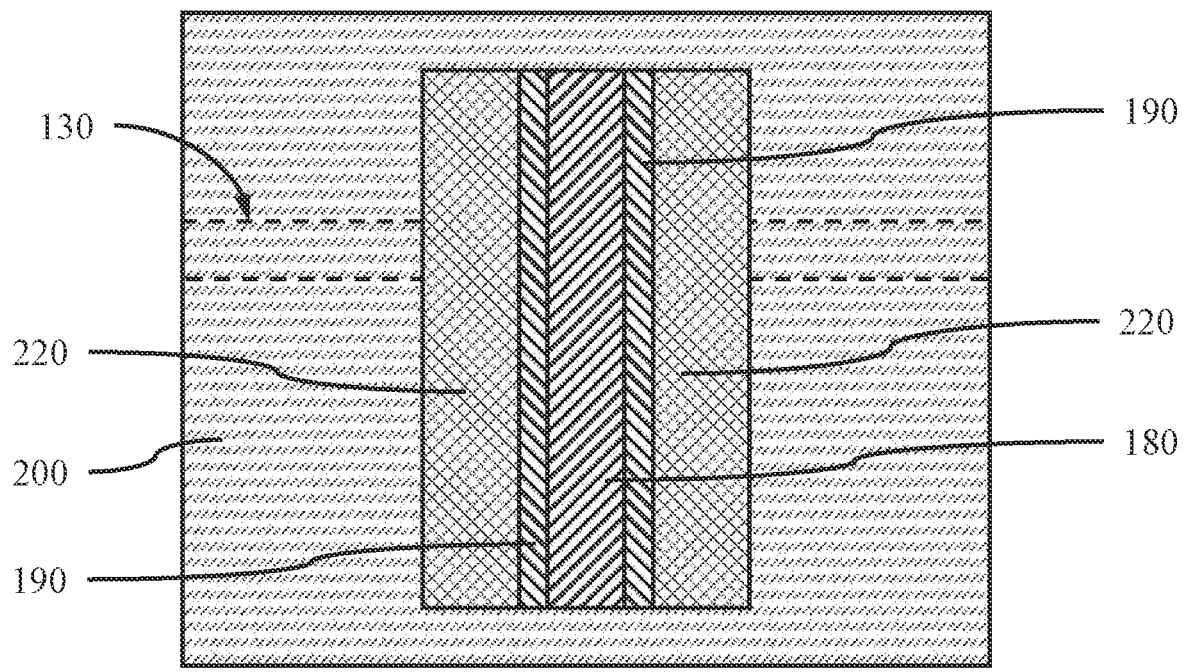
FIG. 16 is a top view showing the first pair of disposable spacers formed on the insulating layer on opposite sides of a lower nanosheet, in accordance with an embodiment of the present invention.

FIG. 16 is a top view showing the first pair of disposable spacers formed on the insulating layer on opposite sides of a lower nanosheet, in accordance with an embodiment of the present invention.

In one or more embodiments, the first pair of disposable spacers 220 can be formed on the insulating layer 200, where the disposable spacers 220 can extend along the lower edge of the sidewall spacers 190 and dummy gate structure.

Figure 17:
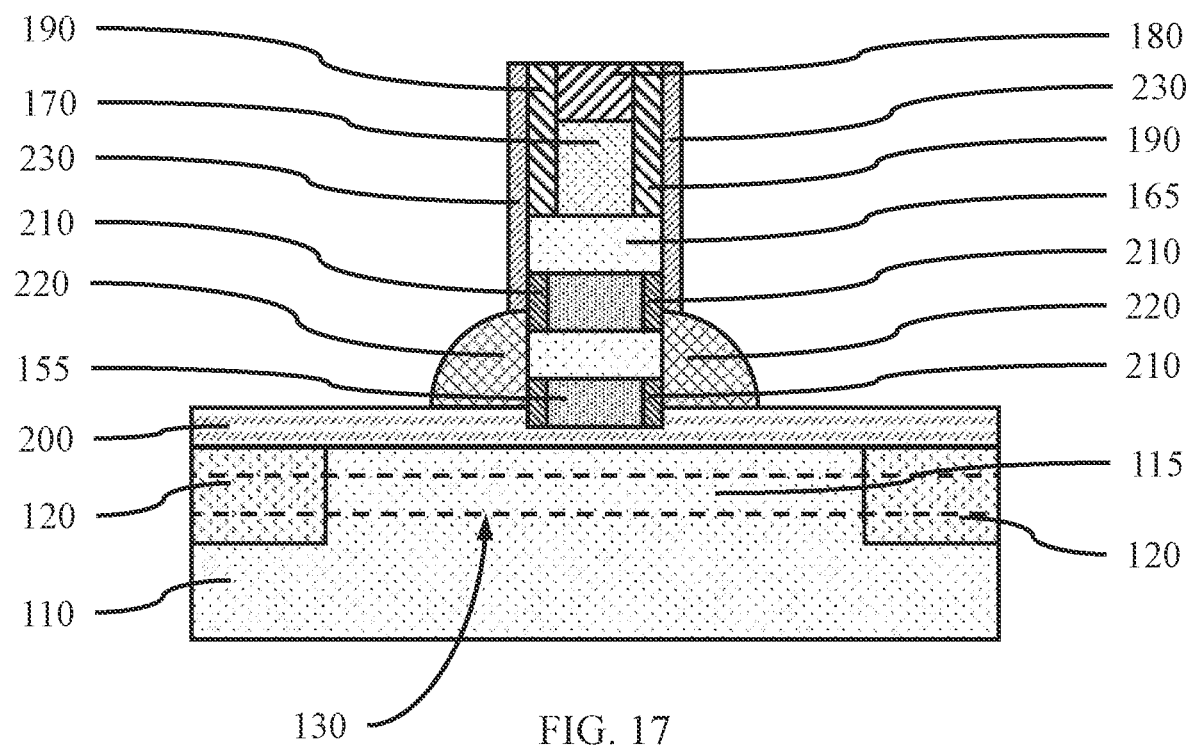
FIG. 17 is a cross-sectional side view perpendicular to FIG. 13 showing a second pair of disposable spacers formed on opposite sides of the dummy gate structure and the stack of semiconductor channel segments and sacrificial segments above the first pair of disposable spacers, in accordance with an embodiment of the present invention.

FIG. 17 is a cross-sectional side view perpendicular to FIG. 13 showing a second pair of disposable spacers formed on opposite sides of the dummy gate structure and the stack of semiconductor channel segments and sacrificial segments above the first pair of disposable spacers, in accordance with an embodiment of the present invention.

In one or more embodiments, a second pair of disposable spacers 230 can be formed on opposite sides of the dummy gate structure and the stack of semiconductor channel segments 165 and sacrificial segments 155 above the first pair of disposable spacers 220. The second pair of disposable spacers 230 can be formed by a conformal deposition (e.g., ALD, PEALD), and etched back with a selective, isotropic etch.

In various embodiments, the second pair of disposable spacers 230 can be a selectively etchable material, including, but not limited to, amorphous silicon (a-Si), amorphous carbon (a-C), silicon oxide (SiO), silicon nitride (SiN), silicon oxynitride (SiON), silicon carbide (SiC), and combinations thereof. The first pair of disposable spacers 220 can be selectively etchable relative to the second pair of disposable spacers 230, sidewall spacers 190, and dummy gate cap 180.

Figure 18:
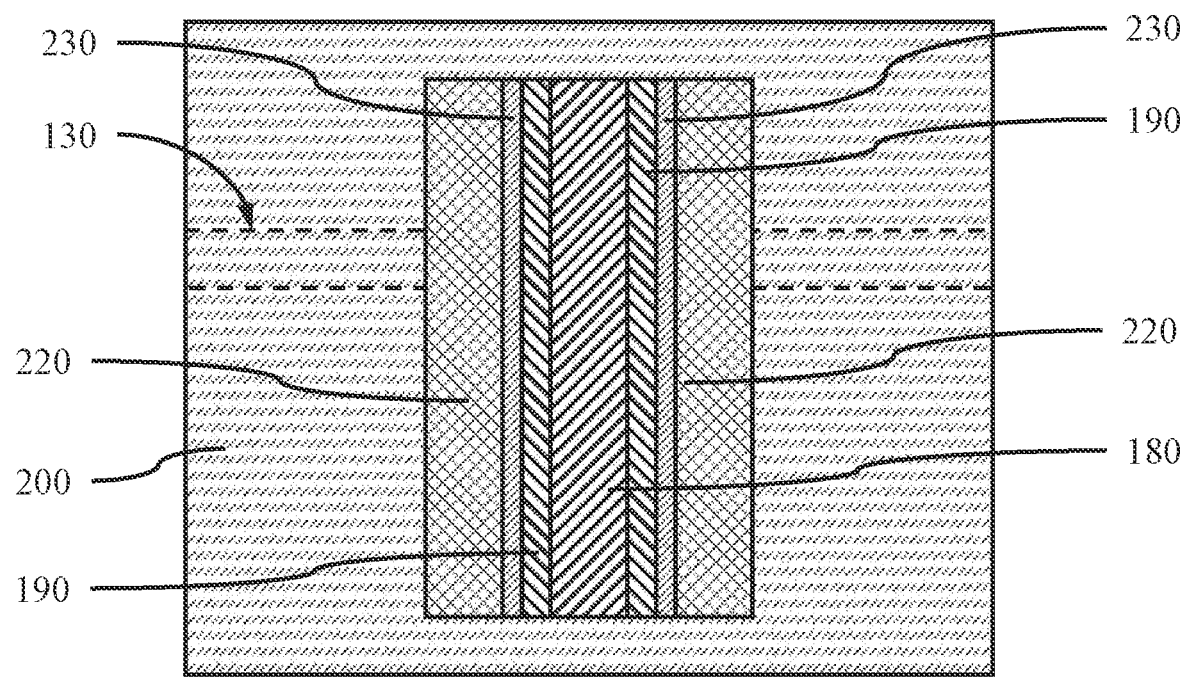
FIG. 18 is a top view showing second pair of disposable spacers formed on opposite sides of the dummy gate structure and the stack of semiconductor channel layers and sacrificial layers above the first pair of disposable spacers, in accordance with an embodiment of the present invention.

FIG. 18 is a top view showing second pair of disposable spacers formed on opposite sides of the dummy gate structure and the stack of semiconductor channel layers and sacrificial layers above the first pair of disposable spacers, in accordance with an embodiment of the present invention.

In one or more embodiments, the second pair of disposable spacers 230 can be formed on the first pair of disposable spacers 220, where the second pair of disposable spacers 230 can extend along the sidewall spacers 190 and dummy gate structure above the first pair of disposable spacers 220.

Figure 19:
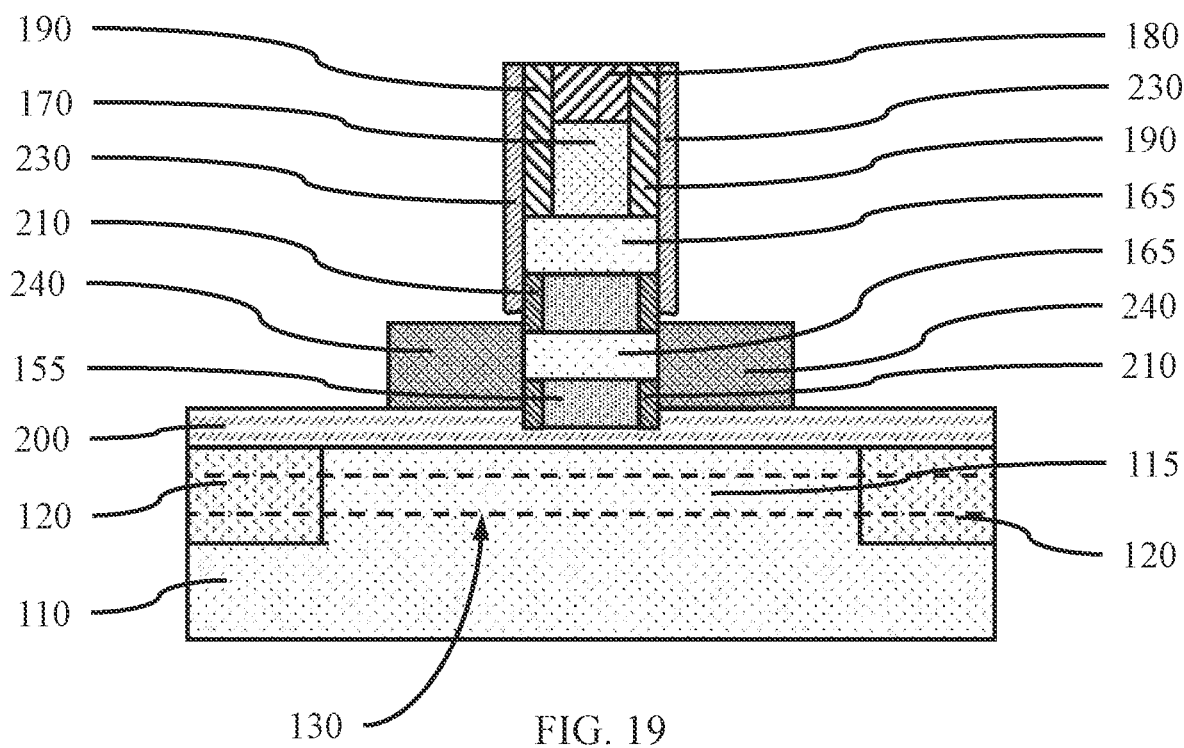
FIG. 19 is a cross-sectional side view perpendicular to FIG. 13 showing removal of the first pair of disposable spacers, and formation of first pair of source/drains on opposite sides of the lower channel segment, in accordance with an embodiment of the present invention.

FIG. 19 is a cross-sectional side view perpendicular to FIG. 13 showing removal of the first pair of disposable spacers, and formation of first pair of source/drains on opposite sides of the lower channel segment, in accordance with an embodiment of the present invention.

In one or more embodiments, the first pair of disposable spacers 220 can be selectively removed to expose the lower portion of the sidewall spacers 190 and the lower channel segment 165.

In one or more embodiments, a first pair of source/drains 240 can be formed on opposite sides of the lower channel segment 165, where the source/drains 240 can be formed by a lateral epitaxial growth process. The source/drains 240 can be formed on the top surface of the insulating layer 200. The first pair of source/drains 240 can be doped to be n-type source/drains or p-type source/drains depending on the intended arrangement of the stacked nFET and pFET.

Figure 20:
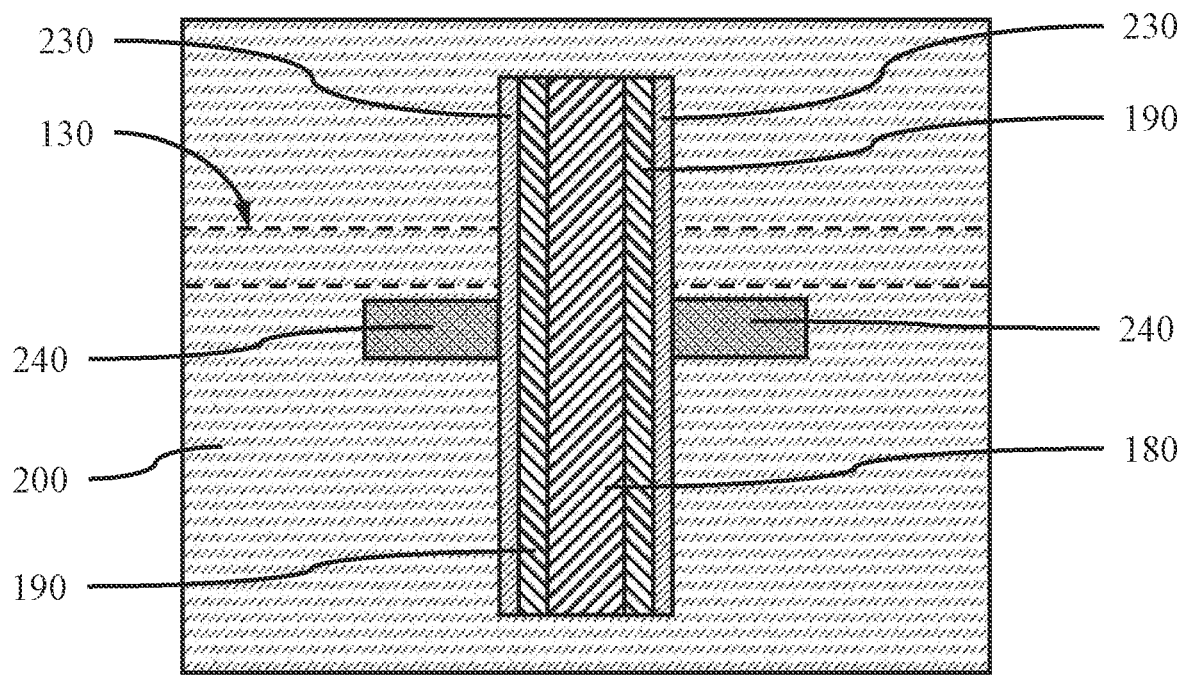
FIG. 20 is a top view showing removal of the first pair of disposable spacers, and formation of source/drains on opposite sides of the dummy gate structure, in accordance with an embodiment of the present invention.

FIG. 20 is a top view showing removal of the first pair of disposable spacers, and formation of source/drains on opposite sides of the dummy gate structure, in accordance with an embodiment of the present invention.

In one or more embodiments, a portion of the source/drains 240 can be below the second pair of disposable spacers 230 and extend outward from the dummy gate structure.

Figure 21:
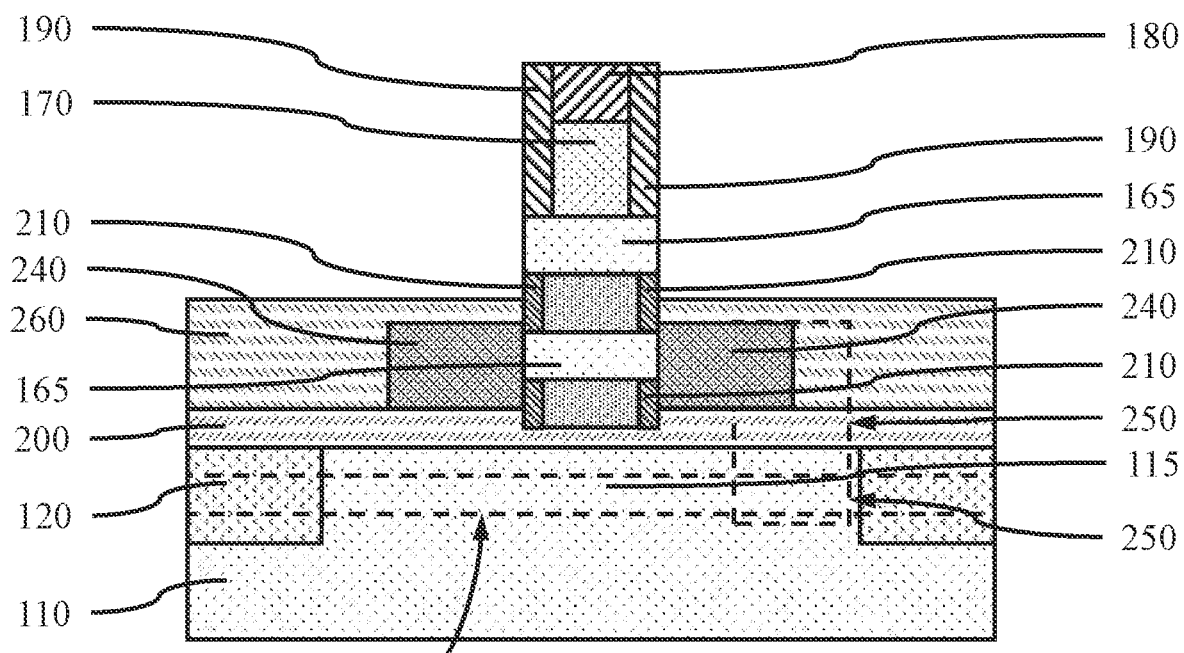
FIG. 21 is a cross-sectional side view perpendicular to FIG. 13 showing formation of a source/drain contact between the power rail and a source/drain, and formation of a cover layer on the first pair of source/drains, in accordance with an embodiment of the present invention.

FIG. 21 is a cross-sectional side view perpendicular to FIG. 13 showing formation of a source/drain contact between the power rail and a source/drain, and formation of a cover layer on the first pair of source/drains, in accordance with an embodiment of the present invention.

In one or more embodiments, a source/drain contact 250 can be formed between the power rail 130 and one of the first pair of source/drains 240. The source/drain contact 250 can be formed by etching an opening in the isolation layer 120 adjoining both the power rail 130 and source/drain 240, and filling the opening with a conductive material, for example, a metal.

In one or more embodiments, a cover layer 260 can be formed on the first pair of source/drains 240 and the source/drain contact 250, where the cover layer 260 can be formed by a blanket deposition, for example, chemical vapor deposition (CVD), plasma enhanced CVD (PECVD), or a combination thereof.

In various embodiments, the cover layer 260 can be an insulating dielectric material, including, but not limited to, silicon oxide (SiO), silicon nitride (SiN), silicon oxynitride (SiON), silicon carbide (SiC), and combinations thereof.

Figure 22:
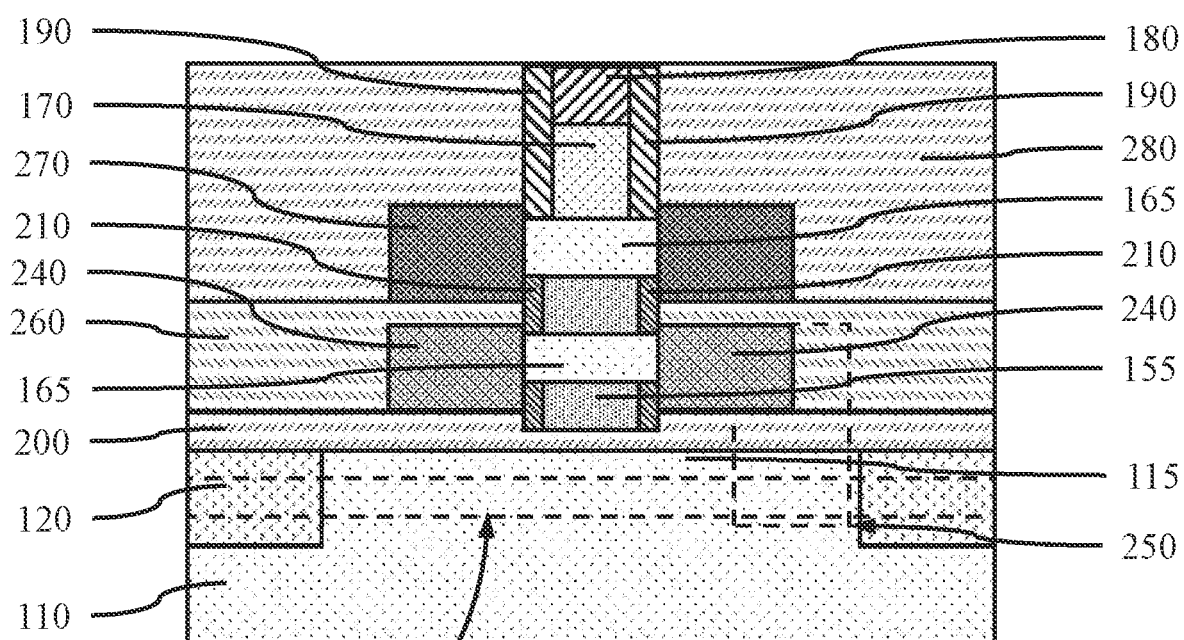
FIG. 22 is a cross-sectional side view perpendicular to FIG. 13 showing formation of a second pair of source/drains on the cover layer, and formation of a fill layer on the second pair of source/drains, in accordance with an embodiment of the present invention.

FIG. 22 is a cross-sectional side view perpendicular to FIG. 13 showing formation of a second pair of source/drains on the cover layer, and formation of a fill layer on the second pair of source/drains, in accordance with an embodiment of the present invention.

In one or more embodiments, a second pair of source/drains 270 can be formed on opposite sides of the upper channel segment 165, where the source/drains 270 can be formed by a lateral epitaxial growth process. The second pair of source/drains 270 can be formed on the top surface of the cover layer 260. The source/drains 270 can be taller than the upper channel segment 165, so a portion of the source/drains 270 are on the sidewall spacers 190 and inner spacers 210. The source/drains 270 can be doped to be n-type source/drains or p-type source/drains depending on the intended arrangement of the stacked nFET and pFET, where the second pair of source/drains 270 can have the opposite doping type from the first pair of source/drains 240.

In one or more embodiments, a fill layer 280 can be formed on the second pair of source/drains 270 and cover layer 260, where the fill layer 280 can be formed by a blanket deposition. The fill layer 280 can cover the sidewalls of the sidewall spacers 190.

Figure 23:
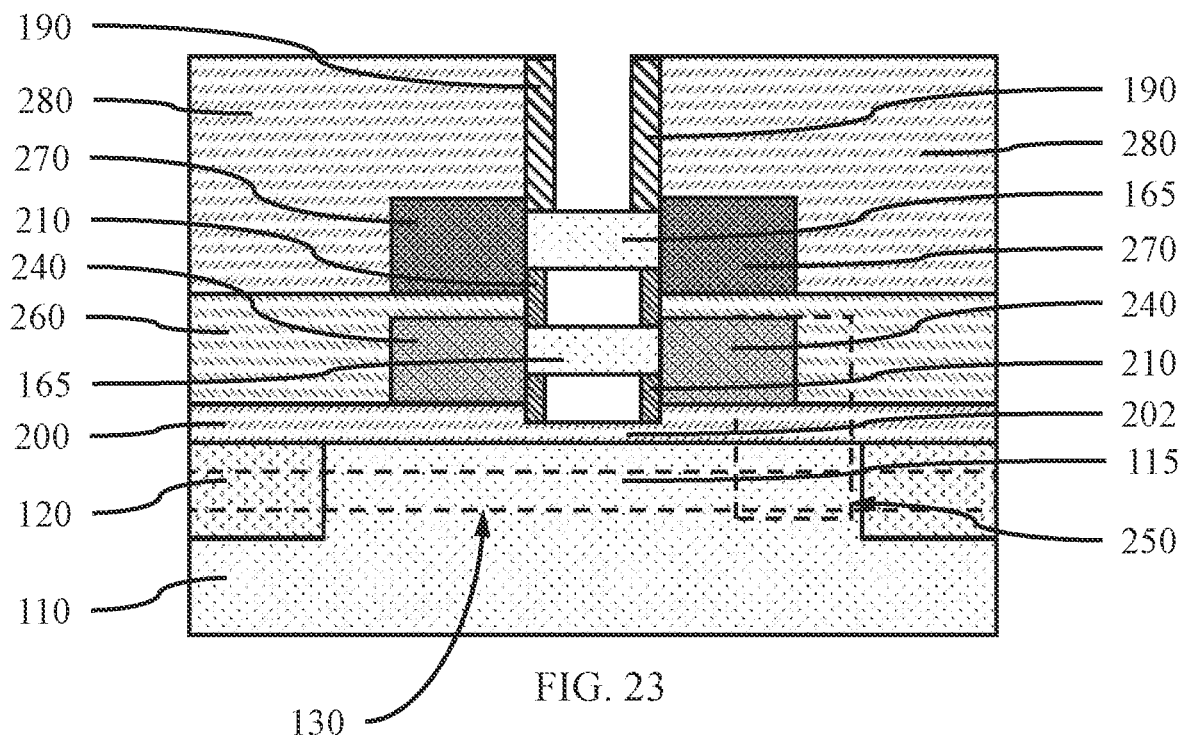
FIG. 23 is a cross-sectional side view perpendicular to FIG. 13 showing the dummy gate fill removed from the dummy gate structure to expose upper and lower semiconductor channel layers, in accordance with an embodiment of the present invention.

FIG. 23 is a cross-sectional side view perpendicular to FIG. 13 showing the dummy gate fill removed from the dummy gate structure to expose upper and lower semiconductor channel layers, in accordance with an embodiment of the present invention.

In one or more embodiments, the dummy gate cap 180 and dummy gate fill 170 can be removed from between the sidewall spacers 190 and inner spacers 210 around the upper and lower channel segments 165. The dummy gate cap 180 and dummy gate fill 170 can be removed using selective, isotropic etches (e.g., wet chemical etch) to expose the upper and lower channel segments 165. The upper semiconductor channel segment and lower semiconductor channel segment can be vertically aligned over the support pillar 115.

Figure 24:
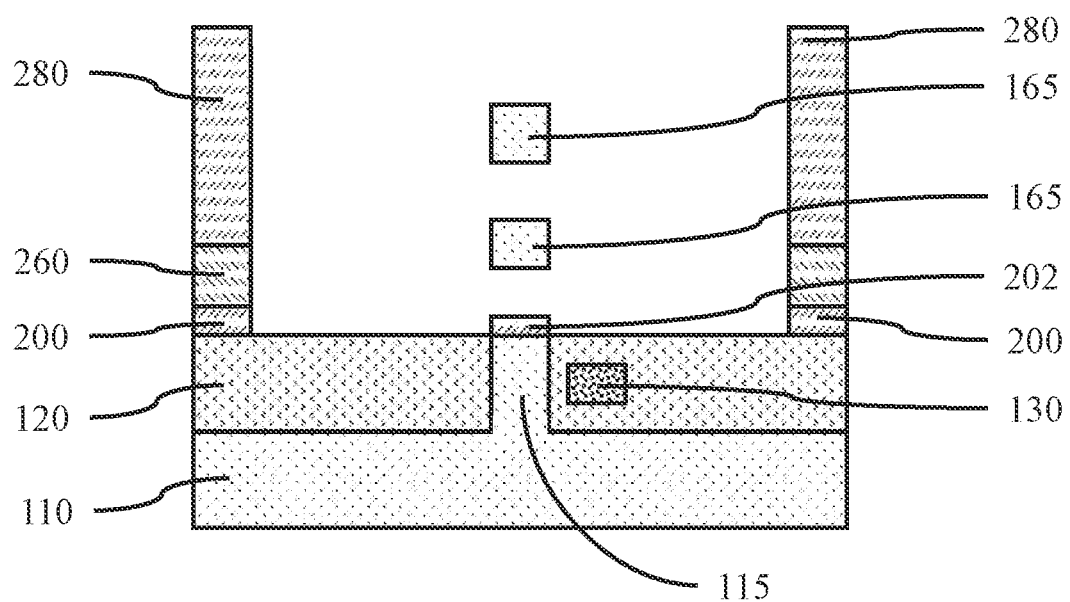
FIG. 24 is a cross-sectional side view showing the dummy gate fill removed from the dummy gate structure to expose upper and lower semiconductor channel layers and the portion of the insulating layer, in accordance with an embodiment of the present invention.

FIG. 24 is a cross-sectional side view showing the dummy gate fill removed from the dummy gate structure to expose upper and lower semiconductor channel layers and the portion of the insulating layer, in accordance with an embodiment of the present invention.

In one or more embodiments, the removal of the dummy gate fill 170 can expose the portion 202 of the insulating layer 200 between the lower sacrificial segment 155 and support pillar 115. Sidewall portions of the insulating layer 200, cover layer 260, and fill layer 280 can be exposed by removal of the dummy gate cap 180 and dummy gate fill 170. The top surface of the isolation layer 120 can also be exposed by removal of the dummy gate fill 170.

Figure 25:
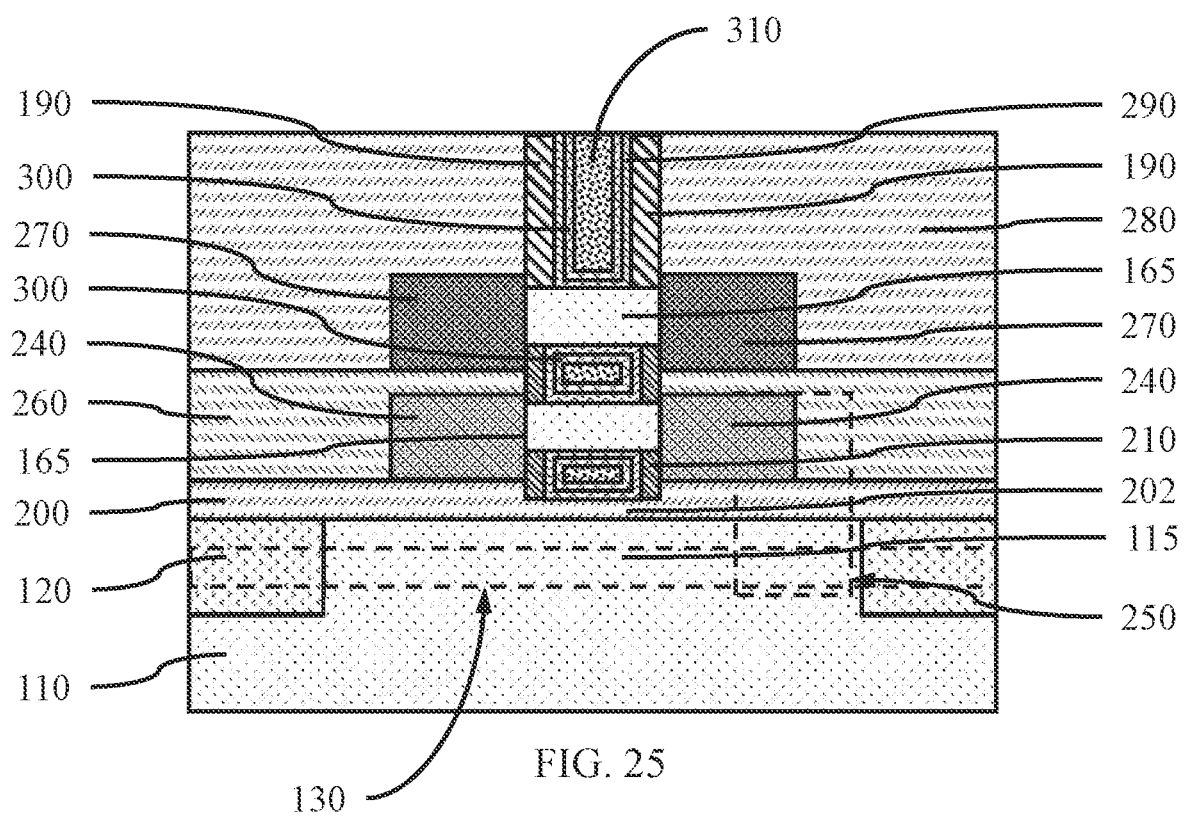
FIG. 25 is a cross-sectional side view perpendicular to FIG. 24 showing formation of an active gate structure on the upper and lower semiconductor channel segments, in accordance with an embodiment of the present invention.

FIG. 25 is a cross-sectional side view perpendicular to FIG. 24 showing formation of an active gate structure on the upper and lower semiconductor channel segments, in accordance with an embodiment of the present invention.

In one or more embodiments, an active gate structure can be formed on the upper and lower semiconductor channel layers 165. A gate dielectric layer 290 can be formed on the exposed surfaces of the upper and lower channel segments 165, sidewall portions of the insulating layer 200, cover layer 260, and fill layer 280, and portion 202 of the insulating layer 200. The gate dielectric layer 290 can be formed by a conformal deposition (e.g., ALD, PEALD). A first work function material layer 300 can be formed on the gate dielectric layer 290, where the first work function material layer 300 can be formed by a conformal deposition. A first conductive gate fill 310 can be formed on the first work function material layer 300, where the first conductive gate fill 310 can be formed by a conformal deposition, a blanket deposition, or a combination thereof.

In various embodiments, the first work function material layer 300 can include, but not necessarily be limited to, titanium nitride (TiN), tantalum nitride (TaN) or ruthenium (Ru), for a PFET. The work function layer 220 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET. The work function material (WFM) can form the first work function material layer 300 on the gate dielectric layer 290.

The first work function material layer 300 can have a thickness in the range of about 1 nm to about 8 nm, or about 2 nm to about 5 nm, or about 1 nm to about 3 nm, or about 2 nm, although other thicknesses are contemplated.

In various embodiments, the first conductive gate fill 310 can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), tantalum carbide (TaC), a copper manganese alloy (Cu—Mn), or any suitable combination thereof.

Figure 26:
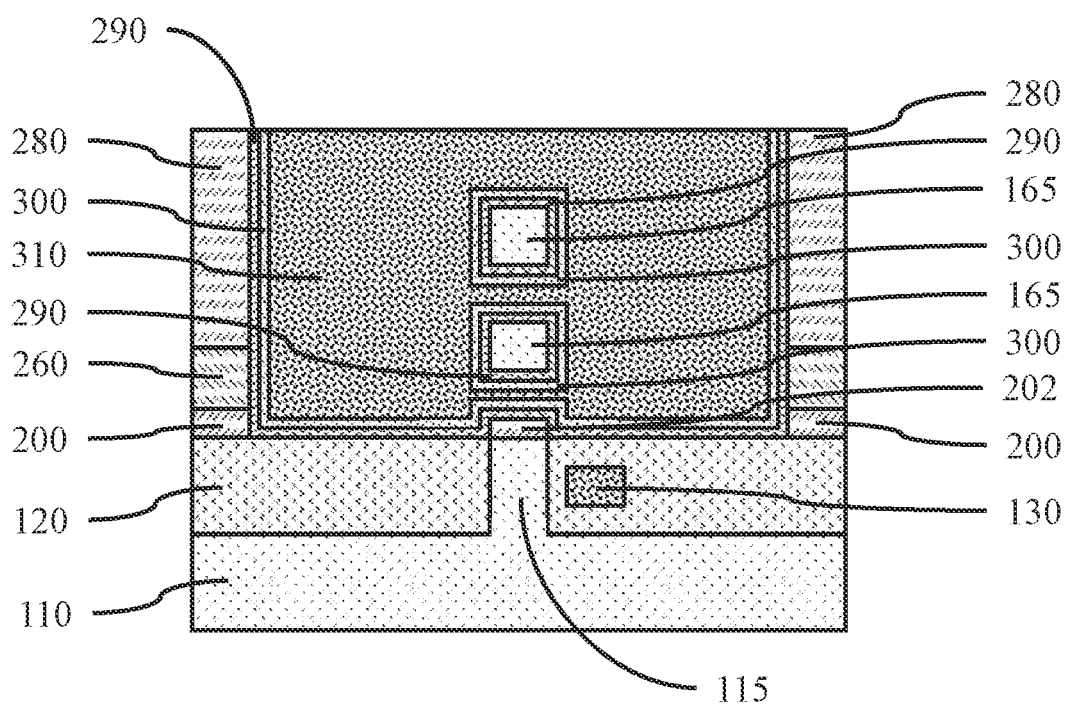
FIG. 26 is a cross-sectional side view showing formation of an active gate structure on the upper and lower semiconductor channel segments and the portion of the insulating layer, in accordance with an embodiment of the present invention.

FIG. 26 is a cross-sectional side view showing formation of an active gate structure on the upper and lower semiconductor channel segments and the portion of the insulating layer, in accordance with an embodiment of the present invention.

In one or more embodiments, the active gate structure, including the gate dielectric layer 290, first work function material layer 300, and first conductive gate fill 310 can surround the upper and lower semiconductor channel layers 165 to form gate-all-around (GAA) structures.

Figure 27:
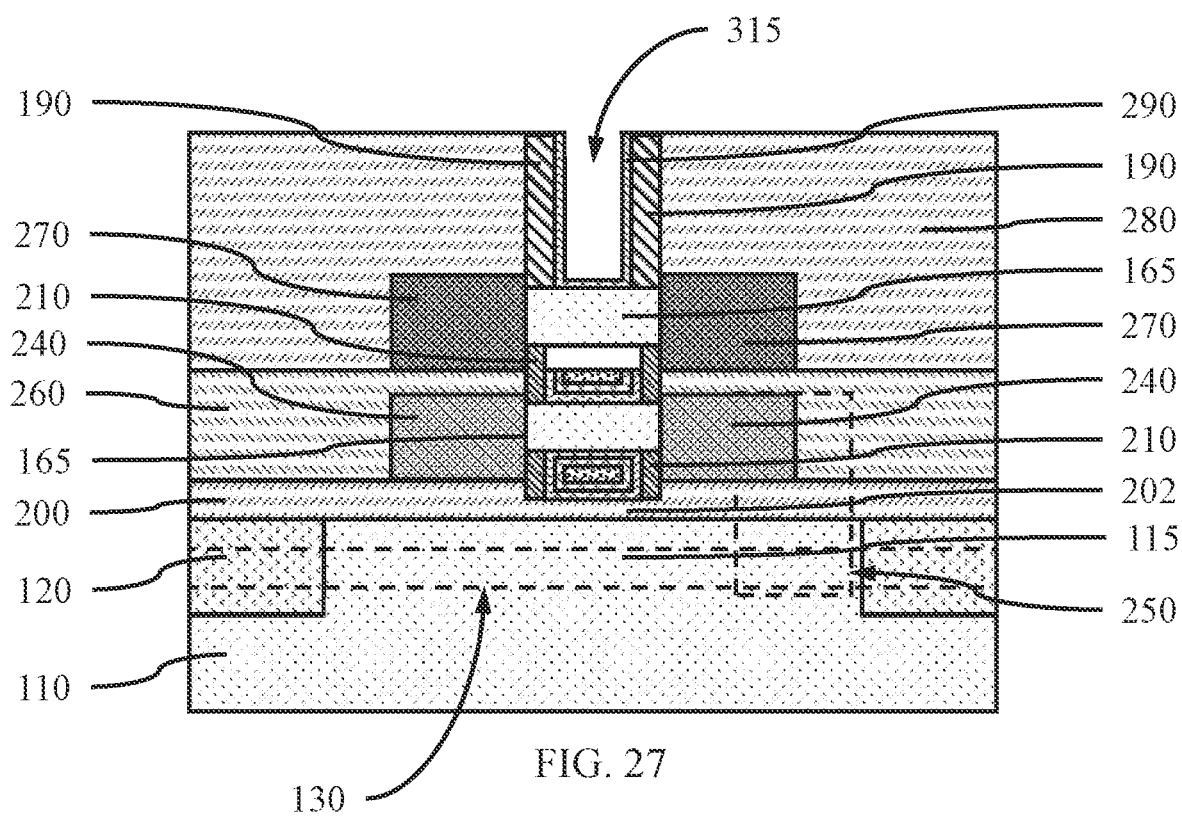
FIG. 27 is a cross-sectional side view perpendicular to FIG. 24 showing removal of an upper portion of a conductive gate fill and work function material layer from the active gate structure to expose the gate dielectric layer on the upper semiconductor channel segment, in accordance with an embodiment of the present invention.

FIG. 27 is a cross-sectional side view perpendicular to FIG. 24 showing removal of an upper portion of a conductive gate fill and work function material layer from the active gate structure to expose the gate dielectric layer on the upper semiconductor channel segment, in accordance with an embodiment of the present invention.

In one or more embodiments, an upper portion of a first conductive gate fill 310 and first work function material layer 300 can be removed from the active gate structure to expose the gate dielectric layer 290 on the semiconductor channel layers 165. The upper portion of a conductive gate fill 310 can be removed using a selective isotropic etch, and the first work function material layer 300 can be removed using another selective isotropic etch that leaves the gate dielectric layer 290 on the upper semiconductor channel layer 165. Removal of the upper portion of a conductive gate fill 310 and first work function material layer 300 can form a cavity 315 between the gate dielectric layer 290 on the sidewall spacers 190.

Figure 28:
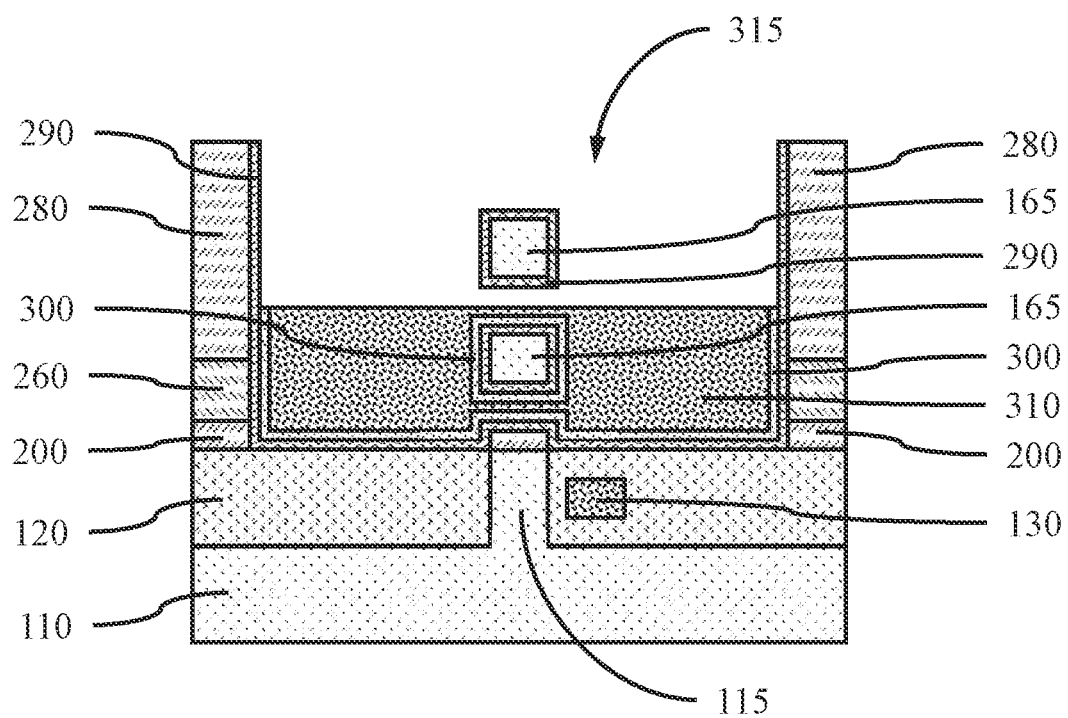
FIG. 28 is a cross-sectional side view showing removal of an upper portion of a conductive gate fill and work function material layer from the active gate structure to expose the upper semiconductor channel segment, in accordance with an embodiment of the present invention.

FIG. 28 is a cross-sectional side view showing removal of an upper portion of a conductive gate fill and work function material layer from the active gate structure to expose the upper semiconductor channel segment, in accordance with an embodiment of the present invention.

In various embodiments, a portion of the conductive gate fill 310 can remain on the first work function material layer 300 on the lower semiconductor channel layer 165. The top surface of the conductive gate fill 310 can be between the first work function material layer 300 on the lower semiconductor channel layer 165 and the gate dielectric layer 290 on the upper semiconductor channel layer 165.

Figure 29:
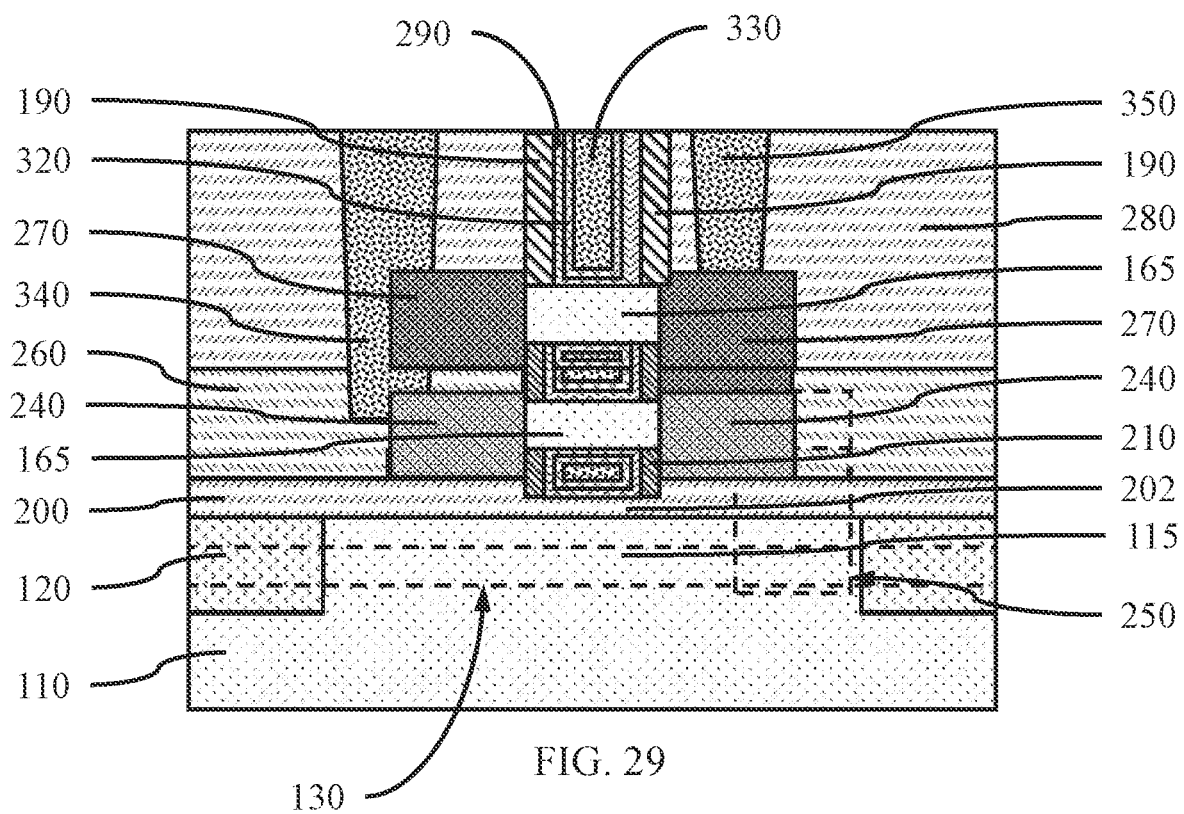
FIG. 29 is a cross-sectional side view perpendicular to FIG. 24 showing formation of a replacement work function material layer and a replacement conductive gate fill on the upper semiconductor channel segment, in accordance with an embodiment of the present invention.

FIG. 29 is a cross-sectional side view perpendicular to FIG. 24 showing formation of a replacement work function material layer and a replacement conductive gate fill on the upper semiconductor channel segment, in accordance with an embodiment of the present invention.

In one or more embodiments, a replacement work function material layer 320 can be formed on the gate dielectric layer 290 on the upper semiconductor channel segment 165 and the sidewall spacers 190, and on the exposed surface of the first conductive gate fill 310. The replacement work function material layer 320 can be formed by a conformal deposition. In various embodiments, the replacement work function material layer 320 can be a different work function material (WFM) than the material of the first work function material layer 300. The replacement work function material layer 320 can be formed on a device configured to be a pFET, and the first work function material layer 300 can be formed on the device configured to be an nFET.

In various embodiments, the replacement work function material layer 320 can include, but not necessarily be limited to, titanium nitride (TiN), tantalum nitride (TaN) or ruthenium (Ru), for a PFET. The work function layer 220 can include, but not necessarily be limited to, titanium nitride (TiN), titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN), lanthanum (La) doped TiN or lanthanum (La) doped TaN, for an NFET. The work function material (WFM) can form the replacement work function material layer 320 on the gate dielectric layer 290.

The replacement work function material layer 320 can have a thickness in the range of about 1 nm to about 8 nm, or about 2 nm to about 5 nm, or about 1 nm to about 3 nm, or about 2 nm, although other thicknesses are contemplated.

In various embodiments, a replacement conductive gate fill 330 can be formed on the replacement work function material layer 320, where the replacement conductive gate fill 330 can be formed by a blanket deposition (e.g., CVD, PECVD).

In various embodiments, the replacement conductive gate fill 330 can be made of a conductive material, which can be a metal, for example, tungsten (W), copper (Cu), cobalt (Co), tantalum (Ta), titanium (Ti), manganese (Mn); a conductive metal compound, for example, tantalum nitride (TaN), titanium nitride (TiN), titanium carbide (TiC), tantalum carbide (TaC), a copper manganese alloy (Cu—Mn), or any suitable combination thereof.

In one or more embodiments, a joint source/drain contact 340 can be formed to both an upper source/drain 270 and a lower source/drain 240 on the same side of the active gate structure.

In one or more embodiments, an upper source/drain contact 350 can be formed to an upper source/drain 270 on a side opposite from the joint source/drain contact 340. The joint source/drain contact 340 and upper source/drain contact 350 can be made of a conductive material, for example, a metal.

Figure 30:
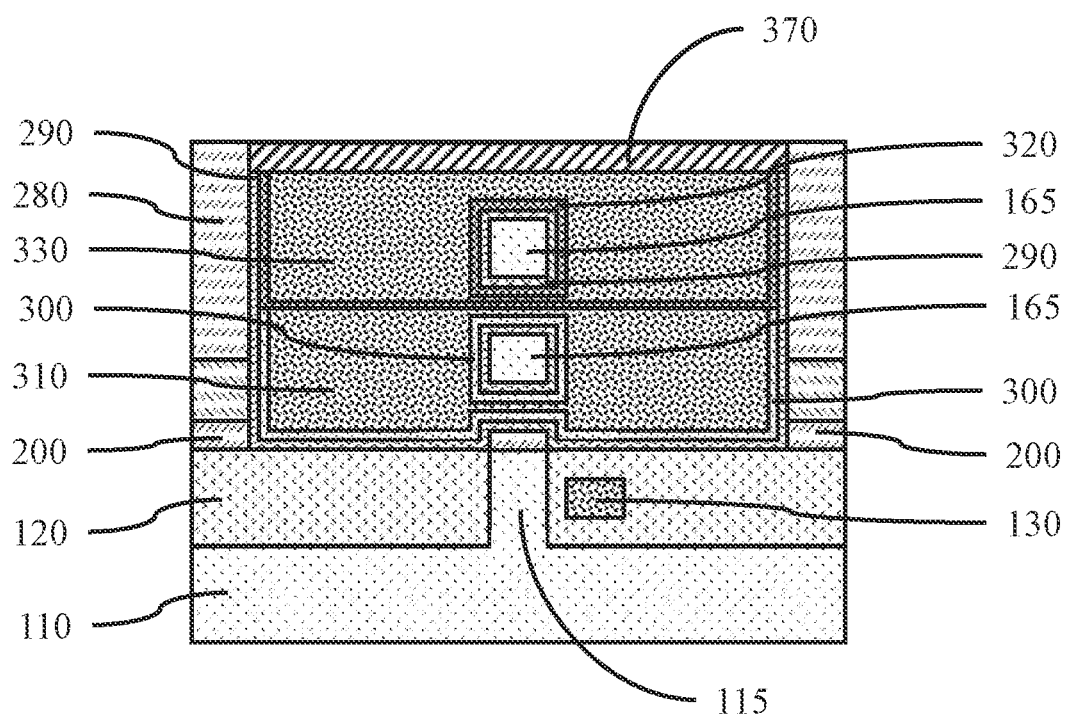
FIG. 30 is a cross-sectional side view showing formation of a replacement work function material layer and a replacement conductive gate fill on the upper semiconductor channel segment, in accordance with an embodiment of the present invention.

FIG. 30 is a cross-sectional side view showing formation of a replacement work function material layer and a replacement conductive gate fill on the upper semiconductor channel segment, in accordance with an embodiment of the present invention.

In one or more embodiments, a replacement work function material layer 320 and a replacement conductive gate fill 330 can be formed on the upper semiconductor channel segment 165 to form a pFET or an nFET.

In one or more embodiments, a replacement gate cap 340 can be formed on the replacement work function material layer 320 and a replacement conductive gate fill 330, where the replacement gate cap 340 can be formed be etching back the replacement work function material layer 320 and a replacement conductive gate fill 330 and blanket depositing the replacement gate cap 340 on the active gate structure.

In various embodiments, the replacement gate cap 370 can be a hardmask material, including, but not limited to, silicon oxide (SiO), silicon nitride (SiN), silicon oxynitride (SiON), silicon carbide (SiC), and combinations thereof.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments Drily and is not intended to be limiting of example embodiments. As used herein, the singular forms "a," "an" and "the" are intended to include the plural forms as dwell, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A stacked field effect transistor device, comprising:
   a lower semiconductor channel segment between a first pair of source/drains;
   an upper semiconductor channel segment between a second pair of source/drains;
   a gate dielectric layer on the upper semiconductor channel segment and the lower semiconductor channel segment;
   a first work function material layer on the gate dielectric layer on the lower semiconductor channel segment;
   a first conductive gate fill on the first work function material layer;
   a replacement work function material layer on the gate dielectric layer on the upper semiconductor channel segment and on the first conductive gate fill, wherein the replacement work function material layer is a different work function material from the first work function material layer,
   a replacement conductive gate fill on the replacement work function material layer; and
   an isolation layer wherein the isolation layer is below the first conductive gate fill, and a power rail in the isolation layer.

2. The stacked field effect transistor device of claim 1, further comprising a source/drain contact between the power rail and one of the first pair of source/drains.

3. The stacked field effect transistor device of claim 2, further comprising an insulating layer between the first pair of source/drains and the isolation layer.

4. The stacked field effect transistor device of claim 3, further comprising a joint source/drain contact in electrical contact with one of the second pair of source/drains and one of the first pair of source/drains.

5. The stacked field effect transistor device of claim 4, further comprising a support pillar beneath both the lower semiconductor channel segment and the upper semiconductor channel segment.

6. A stacked field effect transistor device, comprising:
   a support pillar on a substrate;
   an isolation layer on opposite sides of the support pillar;
   a lower semiconductor channel segment over the support pillar;
   an upper semiconductor channel segment over the lower semiconductor channel segment, wherein the upper semiconductor channel segment and lower semiconductor channel segment are vertically aligned;
   a gate dielectric layer on the upper semiconductor channel segment and the lower semiconductor channel segment;
   a first work function material layer on the gate dielectric layer on the lower semiconductor channel segment;
   a first conductive gate fill on the first work function material layer;
   a replacement work function material layer on the gate dielectric layer on the upper semiconductor channel segment and on the first conductive gate fill, wherein the replacement work function material layer is a different work function material from the first work function material layer,
   a replacement conductive gate fill on the replacement work function material layer; and
   the isolation layer being below the first conductive gate fill, and a power rail in the isolation layer.

7. The stacked field effect transistor device of claim 6, further comprising a first pair of source/drains on opposite sides of the lower semiconductor channel segment.

8. The stacked field effect transistor device of claim 7, further comprising a cover layer on the first pair of source/drains.

9. The stacked field effect transistor device of claim 8, further comprising a second pair of source/drains on opposite sides of the upper semiconductor channel segment, wherein the cover layer separates the second pair of source/drains from the first pair of source/drains.

10. The stacked field effect transistor device of claim 9, further comprising a fill layer on the second pair of source/drains and the cover layer.

11. The stacked field effect transistor device of claim 10, further comprising a joint source/drain contact in electrical contact with one of the second pair of source/drains and one of the first pair of source/drains.

12. A method of forming a stacked field effect transistor device, comprising:
   forming a lower semiconductor channel segment and an upper semiconductor channel segment over the lower semiconductor channel segment on a substrate;

forming a gate dielectric layer on the upper semiconductor channel segment and the lower semiconductor channel segment;

forming a first work function material layer on the upper semiconductor channel segment and the lower semiconductor channel segment;

forming a first conductive gate fill on the first work function material layer;

removing a portion of the first conductive gate fill and the first work function material layer from the upper semiconductor channel segment;

forming a replacement work function material layer on the gate dielectric layer on the upper semiconductor channel segment and on the first conductive gate fill, wherein the replacement work function material layer is a different work function material from the first work function material layer, and forming a replacement conductive gate fill on the replacement work function material layer.

13. The method of claim 12, further comprising forming a support pillar on a substrate, and an isolation layer on opposite sides of the support pillar.

14. The method of claim 13, further comprising forming a power rail in the isolation layer adjacent to the support pillar.

15. The method of claim 14, further comprising forming a first pair of source/drains on opposite sides of the lower semiconductor channel segment.

16. The method of claim 15, further comprising forming a source/drain contact between the power rail and one of the first pair of source/drains.

17. The method of claim 16, further comprising a cover layer on the first pair of source/drains.

18. The method of claim 17, further comprising forming a second pair of source/drains on the cover layer on opposite sides of the upper semiconductor channel segment.

19. The method of claim 18, wherein the cover layer separates the second pair of source/drains from the first pair of source/drains.

* * * * *